US012567477B2

(12) United States Patent
Chiang

(10) Patent No.: US 12,567,477 B2
(45) Date of Patent: ***Mar. 3, 2026

(54) METHOD FOR LUT-FREE MEMORY REPAIR

(71) Applicant: Taiwan Semiconductor Manufacturing Company, Ltd., Hsin-Chu (TW)

(72) Inventor: Katherine H. Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 218 days.

This patent is subject to a terminal disclaimer.

(21) Appl. No.: 18/359,975

(22) Filed: Jul. 27, 2023

(65) Prior Publication Data

US 2023/0368858 A1 Nov. 16, 2023

Related U.S. Application Data

(60) Continuation of application No. 17/751,914, filed on May 24, 2022, now Pat. No. 11,769,568, which is a
(Continued)

(51) Int. Cl.
*G11C 29/14* (2006.01)
*G11C 29/00* (2006.01)
(Continued)

(52) U.S. Cl.
CPC .............. *G11C 29/42* (2013.01); *G11C 29/14* (2013.01); *G11C 29/44* (2013.01); *G11C 29/702* (2013.01);
(Continued)

(58) Field of Classification Search
CPC ......... G11C 29/42; G11C 29/14; G11C 29/44; G11C 29/702; G11C 2029/1202;
(Continued)

(56) References Cited

U.S. PATENT DOCUMENTS 3,681,762 A * 8/1972 Minshull ................ G11C 15/04
711/137
4,408,305 A 10/1983 Kuo
(Continued)

OTHER PUBLICATIONS

MXIC—Macronix International Co., Ltd. "NAND Error Correction Codes Introduction." Published on Feb. 17, 2014.
(Continued)

*Primary Examiner* — Mohammed A Bashar
(74) *Attorney, Agent, or Firm* — Eschweiler & Potashnik, LLC

(57) ABSTRACT

Various embodiments of the present disclosure are directed towards a method for memory repair using a lookup table (LUT)-free dynamic memory allocation process. An array of memory cells having a plurality of rows and a plurality of columns is provided. Further, each memory cell of the array has multiple data states and a permanent state. One or more abnormal memory cells is/are identified in a row of the array and, in response to identifying an abnormal memory cell, the abnormal memory cell is set to the permanent state. The abnormal memory cells include failed memory cells and, in some embodiments, tail memory cells having marginal performance. During a read or write operation on the row, the one or more abnormal memory cells is/are identified by the permanent state and data is read from or written to a remainder of the memory cells while excluding the abnormal memory cell(s).

20 Claims, 26 Drawing Sheets

Related U.S. Application Data division of application No. 16/939,542, filed on Jul. 27, 2020, now Pat. No. 11,367,500.

(60) Provisional application No. 62/951,117, filed on Dec. 20, 2019.

(51) Int. Cl.

| | |
|---|---|
| *G11C 29/42* | (2006.01) |
| *G11C 29/44* | (2006.01) |
| *G11C 29/12* | (2006.01) |

(52) U.S. Cl.

CPC ................. *G11C 2029/1202* (2013.01); *G11C 2029/1204* (2013.01)

(58) Field of Classification Search

CPC ............ G11C 2029/1204; G11C 29/04; G11C 2029/0409; G11C 2029/0411; G11C 2029/4402; G11C 29/4401; G11C 29/76; G11C 29/808; G11C 29/814; G11C 29/816; G11C 29/835; G11C 13/0028; G11C 13/004; G11C 13/0069; G06F 11/1048; G06F 11/3037; G06F 11/3055; G06F 3/0604; G06F 3/0685; G06F 11/0727; G06F 11/0793

See application file for complete search history.

(56) References Cited

U.S. PATENT DOCUMENTS

| | | | |
|---|---|---|---|
| 5,559,837 | A | 9/1996 | Blaker et al. |
| 5,765,199 | A | 6/1998 | Chang et al. |
| 5,835,431 | A | 11/1998 | Miner et al. |
| 8,031,529 | B2 | 10/2011 | Sarin |
| 9,892,034 | B2 | 2/2018 | Lee et al. |
| 11,231,931 | B1 | 1/2022 | Puthoor |
| 2002/0124130 | A1 | 9/2002 | Ilda et al. |
| 2010/0322008 | A1 | 12/2010 | Yoneya et al. |
| 2011/0019491 | A1 | 1/2011 | Kurjanowicz et al. |
| 2011/0188285 | A1 | 8/2011 | Lunt et al. |
| 2014/0268992 | A1 | 9/2014 | Otsuka et al. |
| 2014/0359398 | A1 | 12/2014 | Avila et al. |
| 2016/0335181 | A1 | 11/2016 | Wang et al. |
| 2019/0058116 | A1 | 2/2019 | Yakushenko et al. |
| 2019/0378879 | A1 | 12/2019 | Bertin et al. |
| 2020/0013479 | A1 | 1/2020 | Park et al. |
| 2021/0056023 | A1 * | 2/2021 | Jin ........................ G06F 3/0679 |
| 2021/0182152 | A1 * | 6/2021 | Shin ...................... G11C 16/10 |

OTHER PUBLICATIONS

Notice of Allowance dated Feb. 16, 2022 for U.S. Appl. No. 16/939,542.

Non-Final Office Action dated Jan. 20, 2023 for U.S. Appl. No. 17/751,914.

Notice of Allowance dated May 3, 2023 for U.S. Appl. No. 17/751,914.

* cited by examiner

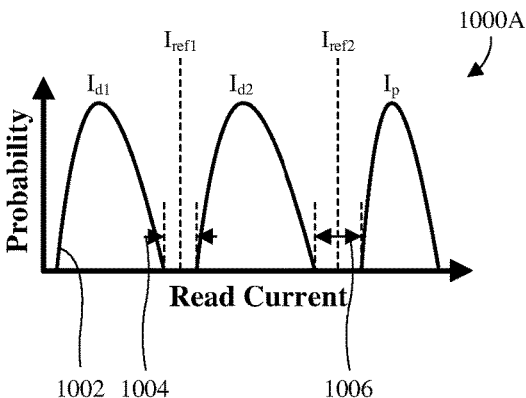
Fig. 10A
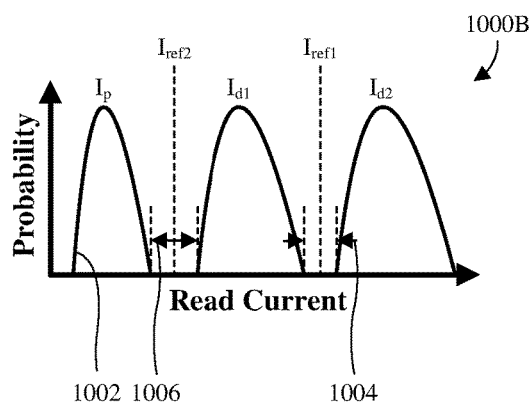
Fig. 10B
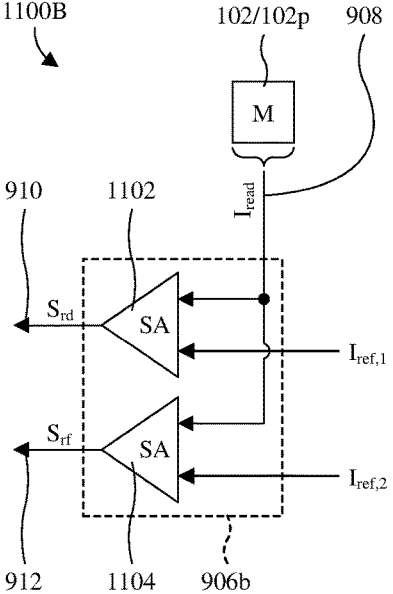
Fig. 11A
Fig. 11B

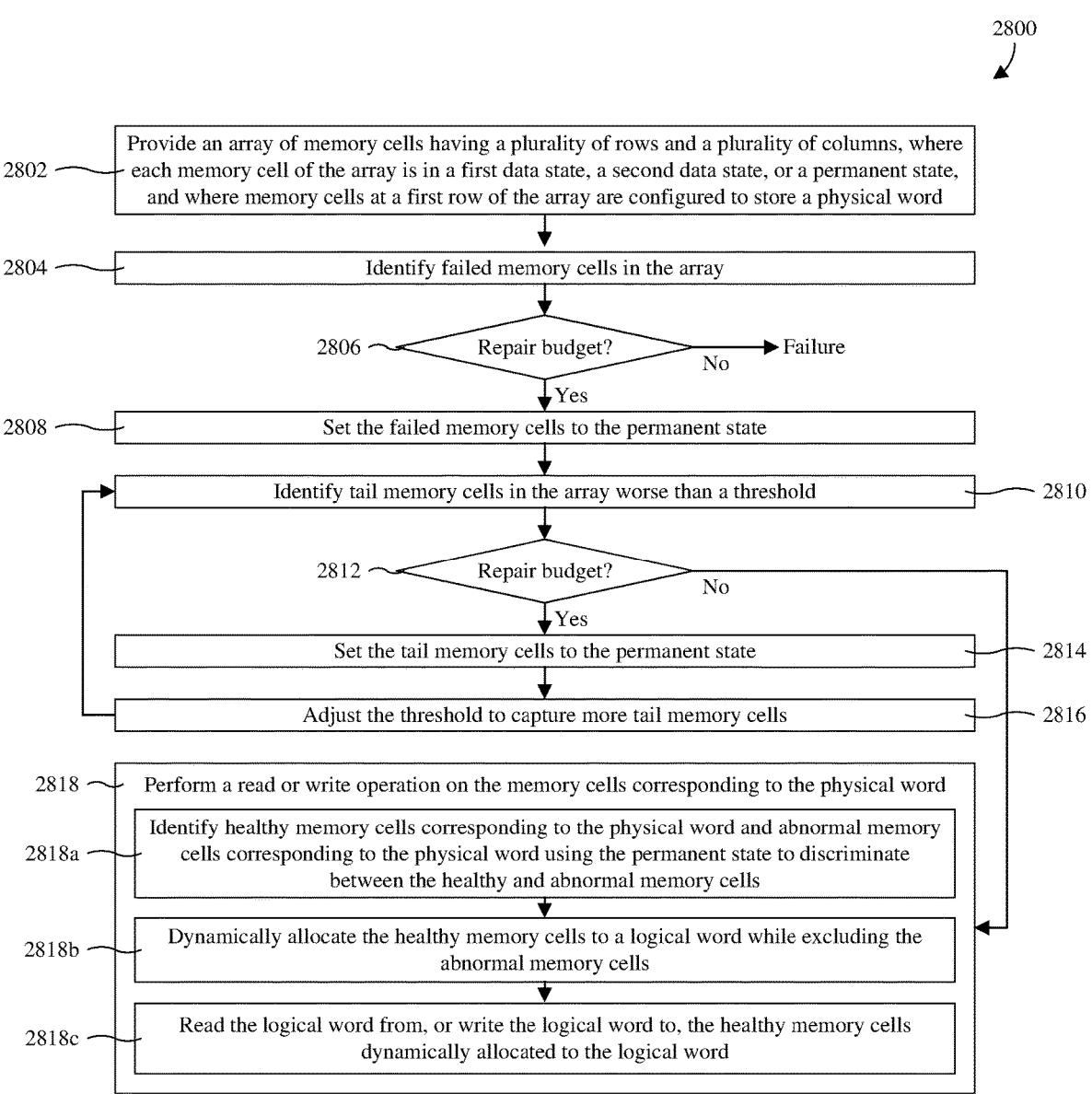

2800

2802 — Provide an array of memory cells having a plurality of rows and a plurality of columns, where each memory cell of the array is in a first data state, a second data state, or a permanent state, and where memory cells at a first row of the array are configured to store a physical word 2804 — Identify failed memory cells in the array 2806 — Repair budget?    No → Failure Yes 2808 — Set the failed memory cells to the permanent state Identify tail memory cells in the array worse than a threshold — 2810

2812 — Repair budget?    No

Yes

Set the tail memory cells to the permanent state — 2814

Adjust the threshold to capture more tail memory cells — 2816

2818 — Perform a read or write operation on the memory cells corresponding to the physical word 2818a — Identify healthy memory cells corresponding to the physical word and abnormal memory cells corresponding to the physical word using the permanent state to discriminate between the healthy and abnormal memory cells 2818b — Dynamically allocate the healthy memory cells to a logical word while excluding the abnormal memory cells 2818c — Read the logical word from, or write the logical word to, the healthy memory cells dynamically allocated to the logical word

Fig. 28

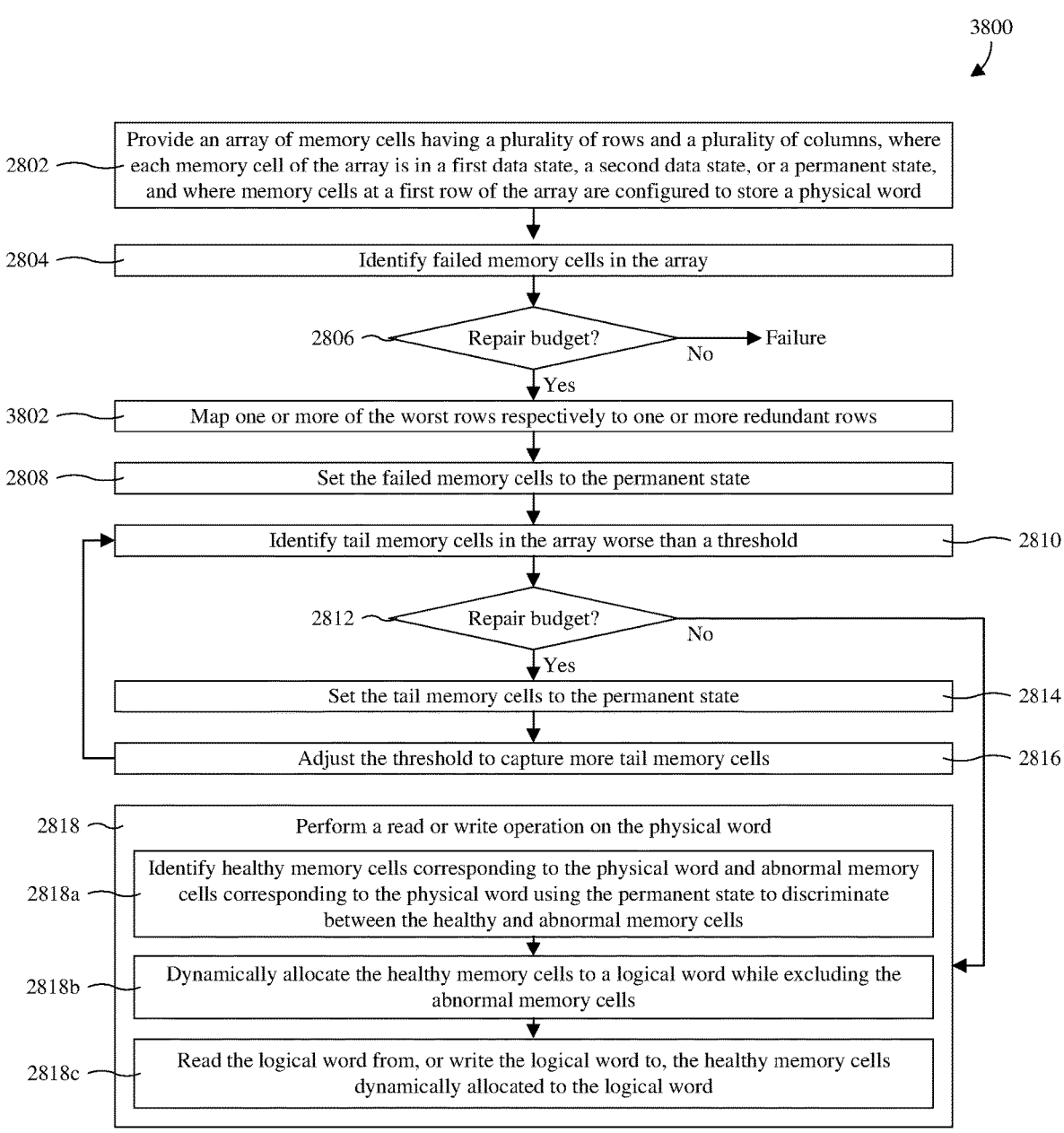

3800

2802 — Provide an array of memory cells having a plurality of rows and a plurality of columns, where each memory cell of the array is in a first data state, a second data state, or a permanent state, and where memory cells at a first row of the array are configured to store a physical word 2804 — Identify failed memory cells in the array 2806 — Repair budget? → No → Failure Yes 3802 — Map one or more of the worst rows respectively to one or more redundant rows 2808 — Set the failed memory cells to the permanent state 2810 — Identify tail memory cells in the array worse than a threshold 2812 — Repair budget? → No Yes 2814 — Set the tail memory cells to the permanent state 2816 — Adjust the threshold to capture more tail memory cells 2818 — Perform a read or write operation on the physical word 2818a — Identify healthy memory cells corresponding to the physical word and abnormal memory cells corresponding to the physical word using the permanent state to discriminate between the healthy and abnormal memory cells 2818b — Dynamically allocate the healthy memory cells to a logical word while excluding the abnormal memory cells 2818c — Read the logical word from, or write the logical word to, the healthy memory cells dynamically allocated to the logical word

Fig. 38

METHOD FOR LUT-FREE MEMORY REPAIR

REFERENCE TO RELATED APPLICATIONS

This application is a Continuation of U.S. application Ser. No. 17/751,914, filed on May 24, 2022, which is a Divisional of U.S. application Ser. No. 16/939,542, filed on Jul. 27, 2020 (now U.S. Pat. No. 11,367,500, issued on Jun. 21, 2022), which claims the benefit of U.S. Provisional Application No. 62/951,117, filed on Dec. 20, 2019. The contents of the above-referenced patent applications are hereby incorporated by reference in their entirety.

BACKGROUND

Many modern-day electronic devices contain electronic memory. Electronic memory may be volatile memory or non-volatile memory. Non-volatile memory is able to retain its stored data in the absence of power, whereas volatile memory loses its stored data when power is lost. Some types of electronic memory include, for example, resistive random-access memory (RRAM), magnetoresistive random-access memory (MRAM), ferroelectric random-access memory (FeRAM), phase-Change Memory (PCM), and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A and 10B illustrate graphs of some different embodiments of read current probability distributions corresponding to different states of memory cells in FIG. 9.

FIGS. 11A and 11B illustrate schematic diagrams of some embodiments of a sense amplifier block of FIG. 9 in which the sense amplifier block is electrically coupled to a memory cell respectively in a data state and a permanent state.

FIG. 28 illustrates a flow chart of some embodiments of the method of FIGS. 18-24, 25A, 25B, 26, 27A, and 27B.

FIG. 38 illustrates a flow chart of some embodiments of the method of FIGS. 31-36, 37A, and 37B.

DETAILED DESCRIPTION

Figure 1:
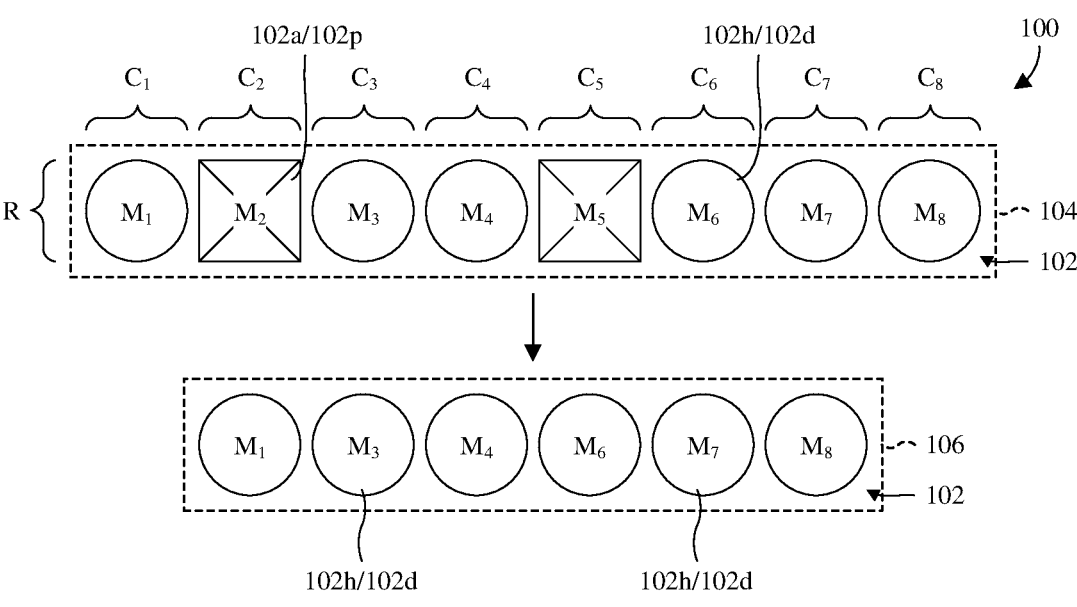
FIG. 1 illustrates a schematic diagram of some embodiments of a lookup table (LUT)-free dynamic memory allocation process for a row of memory cells.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some memory devices comprise a memory array and a lookup table (LUT). The memory array comprises a plurality of memory cells in a plurality of rows and a plurality of columns. Further, at least one of the rows or at least one of the columns is reserved for redundancy. In the event that a memory cell fails, an address of the failed memory cell is stored in the LUT and is mapped to a reserved row or column in the LUT. Further, during each read and write operation to the memory array, a provided address is looked up in the LUT. The lookup determines whether the provided address corresponds to a failed memory cell and, if so, determines a reserved row or column to be used in place of the row or column of the failed memory cell.

A challenge with the above memory devices is that accessing the LUT for each read and write operation leads to latency and increased power consumption. Another challenge is that the LUT consumes a large amount of integrated circuit (IC) chip area and hence degrades memory density. Yet another challenge is that the LUT limits the memory device to row wise or column wise memory repair, which has low repair efficiency compared to bitwise memory repair. For example, in a worst-case scenario, an entire row or column may be allocated to a single failed memory cell. Bitwise memory repair is impracticable because it would increase the size of the LUT to such a degree that memory density would be materially degraded.

Various embodiments of the present disclosure are directed towards a method for memory repair using a LUT-free dynamic memory allocation process, as well as an IC chip configured to perform the LUT-free dynamic memory allocation process. In some embodiments of the method, an array of memory cells having a plurality of rows and a plurality of columns is provided. Further, each memory cell of the array has a first data state, a second data state, and a permanent state. One or more abnormal memory cells is/are identified in a row of the array and, in response to identifying an abnormal memory cell, the abnormal memory cell is set to the permanent state. The abnormal memory cells include failed memory cells and, in some embodiments, tail memory cells having marginal performance. During a read or write operation on the row, the one or more abnormal memory cells is/are identified in the row by the permanent state and data is read from or written to a remainder of the memory cells (e.g., healthy memory cells) in the row while excluding the abnormal memory cells.

By using the permanent state to signify abnormality, memory repair may be performed without a LUT. As such, latency and power consumption may be reduced and memory density may be increased. Additionally, by using the permanent state to signify abnormality, memory repair may be performed bitwise and memory cells may be dynamically allocated using static calculations. By performing memory repair bitwise, repair efficiency may be high. The high repair efficiency may allow the repair budget (e.g., the number of bits that can be repaired) to be increased. The increased repair budget may allow poor performing memory cells to be replaced for improved power efficiency and/or speed. Further, the increased repair budget may allow process and/or design constraints to be relaxed. By dynamically allocating the memory cells using static calculations, the dynamic allocation may be integrated into existing error-correcting code (ECC) circuits for a low impact on IC chip area and low latency.

With reference to FIG. 1, a schematic diagram 100 of some embodiments of a LUT-free dynamic memory allocation process for a row R of memory cells 102 spanning a plurality of columns is provided. The columns are individually labeled $C_{<column\ number>}$, and the memory cells 102 are individually labeled $M_{<column\ number>}$, where the column number is an integer. The memory cells 102 are configured to store a physical word 104.

Each of the memory cells 102 has a first data state, a second data state, and a permanent state. Data memory cells 102d are memory cells in the first and second data states and are schematically illustrated by circles. On the other hand, permanent memory cells 102p are memory cells in the permanent state and are schematically illustrated by squares. The first and second data states may, for example, correspond to a logic "0" and a logic "1" or vice versa. The permanent state is a state that is permanent or is otherwise difficult to change compared to the first and second data states. In some embodiments, the permanent state corresponds to a state of dielectric breakdown for insulators of the memory cells 102. In some embodiments, the memory cells 102 have different resistances respectively in the first data state, the second data state, and the permanent state. In some embodiments, the permanent state has a high resistance that is high relative to resistances of the first and second data states and that may, for example, be modeled as an open circuit. In other embodiments, the permanent state has a low resistance that is low relative to resistances of the first and second data states and that may, for example, be modeled as a short circuit. In some embodiments, the memory cells 102 have different read currents respectively in the first data state, the second data state, and the permanent state.

In advance of the LUT-free dynamic memory allocation process, abnormal memory cells 102a are identified and set to the permanent state, such that the permanent state is used to flag the abnormal memory cells 102a. Because the abnormal memory cells 102a are set to the permanent state, the abnormal memory cells 102a are generally the same as the permanent memory cells 102p. Further, healthy memory cells 102h are generally the same as the data memory cells 102d. The abnormal memory cells 102a are schematically illustrated with crosses, whereas the healthy memory cells 102h are schematically illustrated without crosses.

The abnormal memory cells 102a include failed memory cells and, in some embodiments, tail memory cells. In alternative embodiments, the abnormal memory cells 102a include only failed memory cells. Failed memory cells are memory cells that do not operate at all or that do not operate as intended (e.g., fall outside of design specifications), whereas tail memory cells fall within design specifications but are amongst the poorest performing memory cells. The abnormal memory cells 102a may, for example, be identified by circuit probe (CP) testing or by some other suitable testing. Further, the abnormal memory cells 102a may, for example, be identified during manufacture, during operation, or at some other suitable time.

During the LUT-free dynamic memory allocation process, the healthy memory cells 102h and the abnormal memory cells 102a are identified using the permanent state to distinguish between the healthy memory cells 102h and the abnormal memory cells 102a. Further, the healthy memory cells 102h identified using the permanent state are dynamically allocated to a logical word 106 while excluding the abnormal memory cells 102a identified using the permanent state. The logical word 106 is smaller than the physical word 104 so a total number of memory cells corresponding to the logical word 106 is less than a total number of memory cells corresponding to the physical word 104. As a result, a difference between the total numbers corresponds to redundancy. As illustrated, the total number of memory cells corresponding to the physical word 104 is eight, whereas the total number of memory cells corresponding to the logical word 106 is six, such that there are two memory cells of redundancy. Other suitable numbers are, however, amenable. In some embodiments, the healthy memory cells 102h dynamically allocated to the logical word 106 respectively store 1, 0, 1, 1, 0, 1, where 1 and 0 correspond to the first and second data states. Other suitable values are, however, amenable.

The dynamic allocation is performed from left to right while skipping the abnormal memory cells 102a. Hence, the logical word 106 is dynamically allocated a predetermined number of the leftmost healthy memory cells 102h, where the predetermined number is the same as the number of bits in the logical word 106. Further, the ordering of the healthy memory cells 102h is the same for the logical word 106 as for the physical word 104. To the extent that the numbers and arrangements of abnormal memory cells 102a change, the dynamic allocation changes. This allows new abnormal memory cells to be identified, flagged with the permanent state, and replaced during operation of the memory cells 102. In alternative embodiments, the dynamic allocation may be performed by some other suitable scheme other than left to right.

The LUT-free dynamic memory allocation process is performed during each read and write operation on memory cells corresponding to the physical word 104. Particularly, the healthy memory cells 102h, but not the abnormal memory cells 102a, are dynamically allocated to the logical word 106 using the permanent state as a flag to discriminate between the healthy and abnormal memory cells 102h, 102a. The logical word 106 is then read from, or written to, the healthy memory cells 102h dynamically allocated to the logical word 106.

By flagging the abnormal memory cells 102a using the permanent state, and by then using the LUT-free dynamic memory allocation process to filter out the abnormal memory cells 102a that are flagged during each read and write operation, bitwise memory repair may be achieved without a LUT. Accordingly, latency and power consumption may be low and memory density may be high. By performing memory repair bitwise, repair efficiency may be high. The high repair efficiency may allow the repair budget (e.g., the number of bits that can be repaired) to be increased. For example, the repair budget may be 100 or more times larger than that for column-wise and row-wise LUT-based repair. The increased repair budget may allow tail memory cells to be replaced for improved power efficiency and/or speed. Further, the increased repair budget may allow process and/or design constraints to be relaxed.

The LUT-free dynamic memory allocation process may be performed by static calculation, such that the logic implementing the process is the same regardless of the number of abnormal memory cells 102a and regardless of the arrangement of the abnormal memory cells 102a. Accordingly, the logic implementing the dynamic allocation may be integrated into an ECC circuit or some other suitable circuit supporting operation of the memory cells 102 to reduce the impact on IC chip area and to reduce latency.

In some embodiments, the memory cells 102 are magnetoresistive random-access memory (MRAM) cells, resistive random-access memory (RRAM) cells, ferroelectric random-access memory (FeRAM) cells, or some other suitable type of memory cells. In at least some of such embodiments, the memory cells 102 may be devoid of selectors and/or may be set to the permanent state by dielectric breakdown of insulators separating top and bottom electrodes. In alternative embodiments, the memory cells 102 are one selector-one resistor (1S1R) memory cells comprising individual resistive memory elements and individual selectors. In at least some of such embodiments, the memory cells 102 may be set to the permanent state by dielectric breakdown of insulators in the resistive memory elements and/or in the selectors. The resistive memory element may, for example, be an MRAM cell, a FeRAM cell, an RRAM cell, a phase change memory (PCM) cell, or some other suitable type of resistive memory element.

While FIG. 1 illustrates the row R with specific numbers of columns and memory cells, the row R may have more or less columns and hence more or less memory cells in alternative embodiments. Further, while FIG. 1 illustrates the row R with a specific number and arrangement of abnormal memory cells 102a, different numbers and arrangements of abnormal memory cells 102a are amenable in alternative embodiments. Further yet, while FIG. 1 illustrates the row R with a specific number and arrangement of permanent memory cells 102p, different numbers and arrangements of permanent memory cells 102p are amenable in alternative embodiments.

Figure 2:
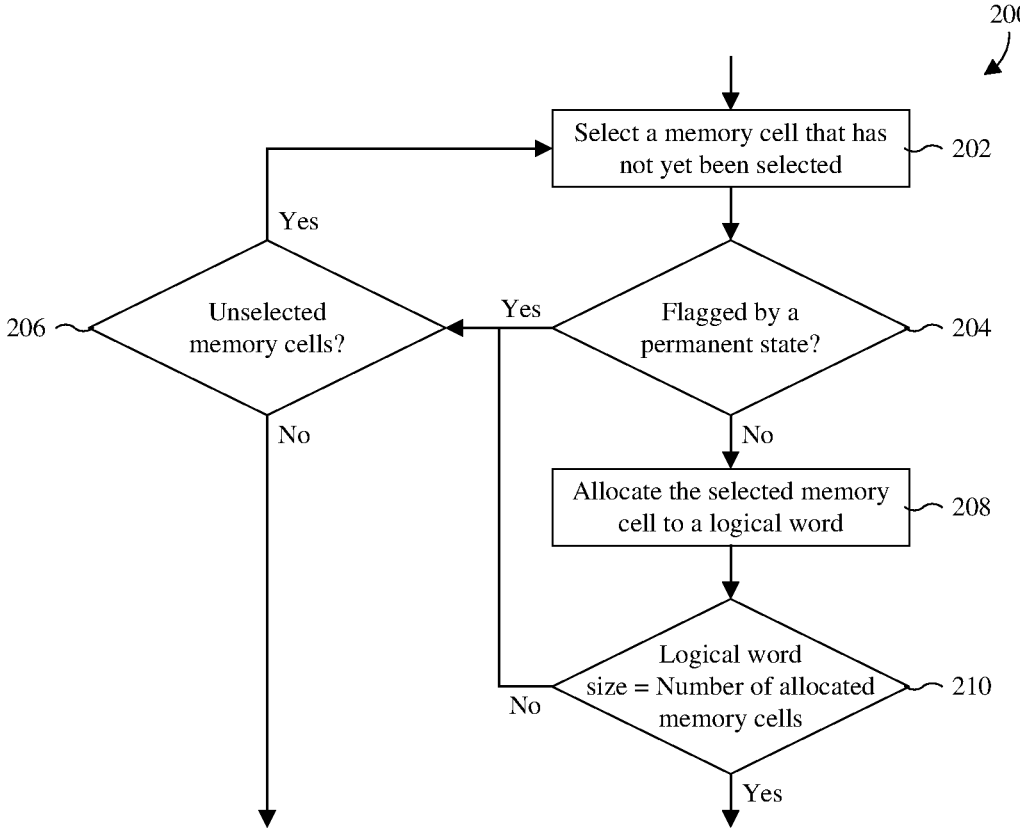
FIG. 2 illustrates a flow chart of some embodiments of the LUT-free dynamic memory allocation process of FIG. 1.

With reference to FIG. 2, a flow chart 200 of some embodiments of the LUT-free dynamic memory allocation process of FIG. 1 is provided.

At act 202, a memory cell that has not yet been selected is selected from those memory cells corresponding to a physical word (see, e.g., 104 in FIG. 1). In some embodiments, the selection is performed from left to right along a row of the physical word. However, other suitable selection schemes are amenable in alternative embodiments.

At act 204, a determination is made as to whether the selected memory cell has been flagged by the permanent state. If the selected memory cell has been flagged by the permanent state, the flow chart 200 proceeds to act 206. Otherwise, the flow chart 200 proceeds to act 208.

At act 206, a determination is made as to whether any memory cells remain unselected. If there are remaining memory cells that have yet to be selected, the flow chart 200 proceeds to act 202 and a new memory cell is selected. Otherwise, the flow chart 200 proceeds to completion with failure. There are too many flagged memory cells.

At act 208, the selected memory cell is allocated to a logical word (see, e.g., 106 in FIG. 1).

At act 210, a determination is made as to whether the size of the logical word is the same as the number of allocated memory cells. If the size of the logical word is the same as the number of allocated memory cells, the flow chart 200 proceeds to completion with success. Otherwise, the flow chart 200 proceeds to act 206.

While the flow chart 200 of FIG. 2 is illustrated and described herein as a series of acts or events, it will be appreciated that the illustrated ordering of such acts or events is not to be interpreted in a limiting sense. Further, not all illustrated acts may be required to implement one or more aspects or embodiments of the description herein, and one or more of the acts depicted herein may be carried out in one or more separate acts and/or phases. While the flow chart 200 of FIG. 2 illustrates and describes the LUT-free dynamic memory allocation process as an iterative process, the LUT-free dynamic memory allocation process may alternatively be a recursive process or some other suitable type of process. Further, the LUT-free dynamic memory allocation process may be performed with parallel processing.

Figure 3A:
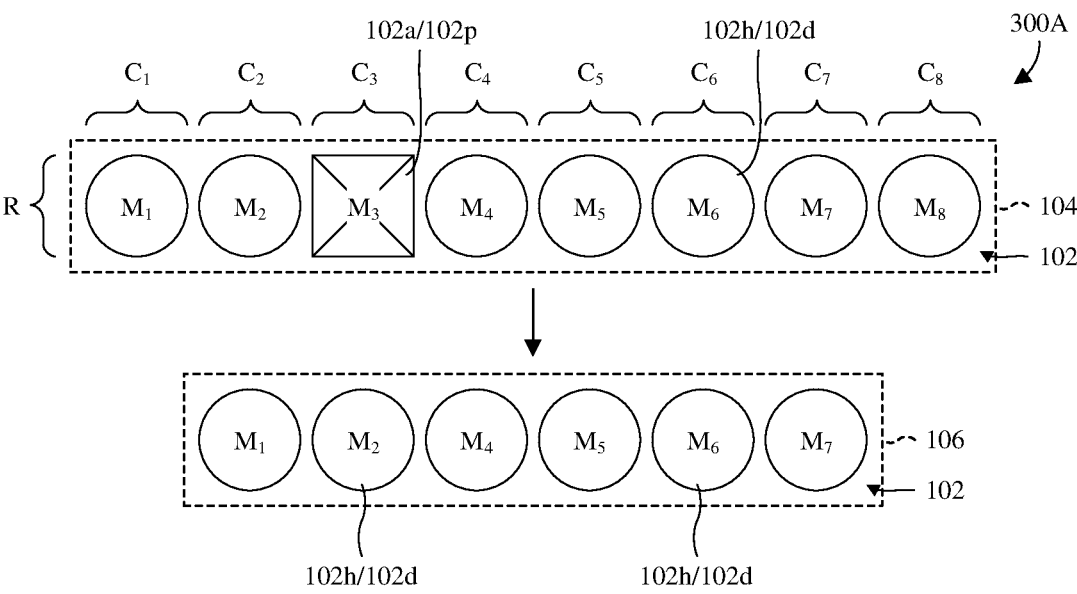
FIGS. 3A-3C illustrate schematic diagrams of some embodiments of the LUT-free dynamic memory allocation process of FIG. 1 using different numbers and arrangements of abnormal memory cells flagged with a permanent state.
Figure 3B:
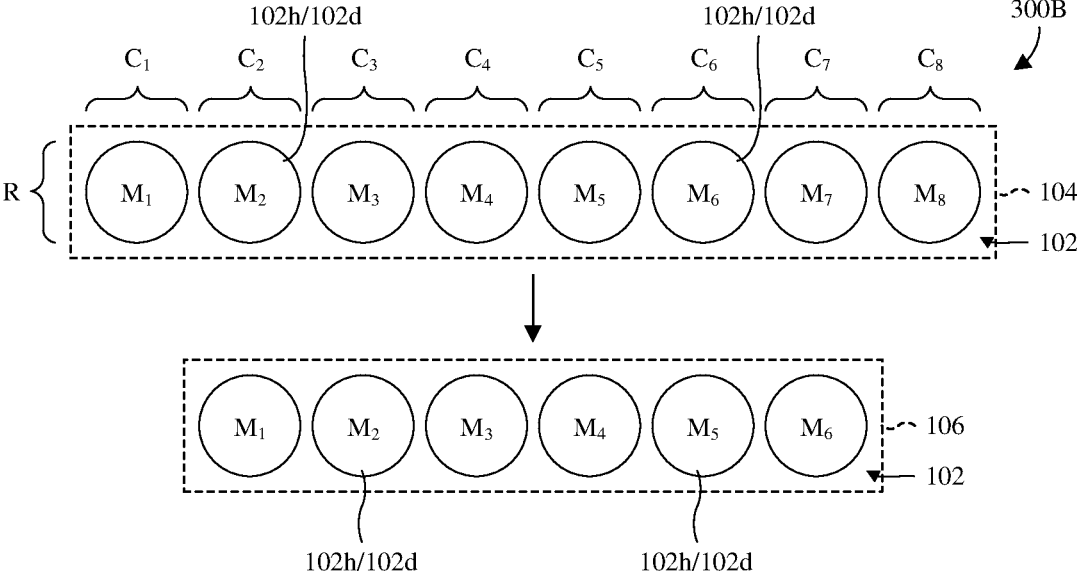
Figure 3C:
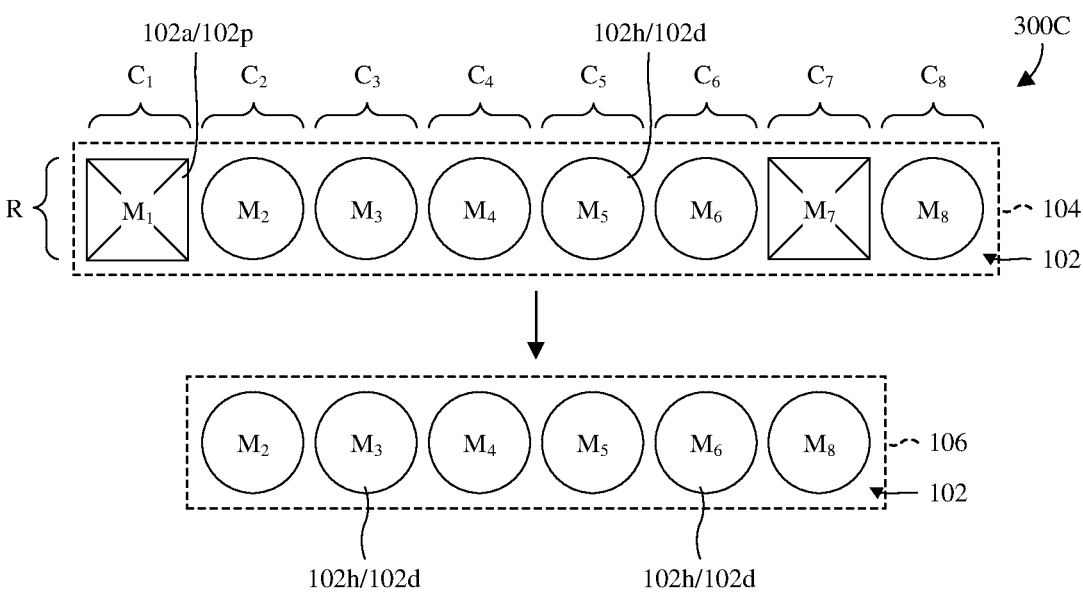

With reference to FIGS. 3A-3C, schematic diagrams 300A-300C of some embodiments of the LUT-free dynamic memory allocation process of FIG. 1 are provided using different numbers and arrangements of abnormal memory cells 102a flagged with the permanent state. In FIG. 3A, the row R has a single abnormal memory cell 102a (e.g., memory cell M₃) corresponding to the physical word 104. Further, the logical word 106 is dynamically allocated memory cells M₁, M₂, and M₄-M₇. Memory cell Mg is reserved for redundancy. In FIG. 3B, the row R has all healthy memory cells 102h corresponding to the physical word 104. In other words, there are no abnormal memory cells flagged with the permanent state. Further, the logical word 106 is dynamically allocated memory cells M₁-M₆. Memory cells M₇ and M₈ are reserved for redundancy. In FIG. 3C, the row R has two abnormal memory cells 102a (e.g., memory cell M₁ and memory cell M₇) corresponding to the physical word 104. Further, the logical word 106 is dynamically allocated memory cells M₂-M₆ and memory cell Mg. No redundancy remains. Notwithstanding the specific numbers and arrangements of abnormal memory cells 102a flagged with the permanent state in FIGS. 1 and 3A-3C, other suitable numbers and arrangements are, however, amenable in alternative embodiments.

Figure 4A:
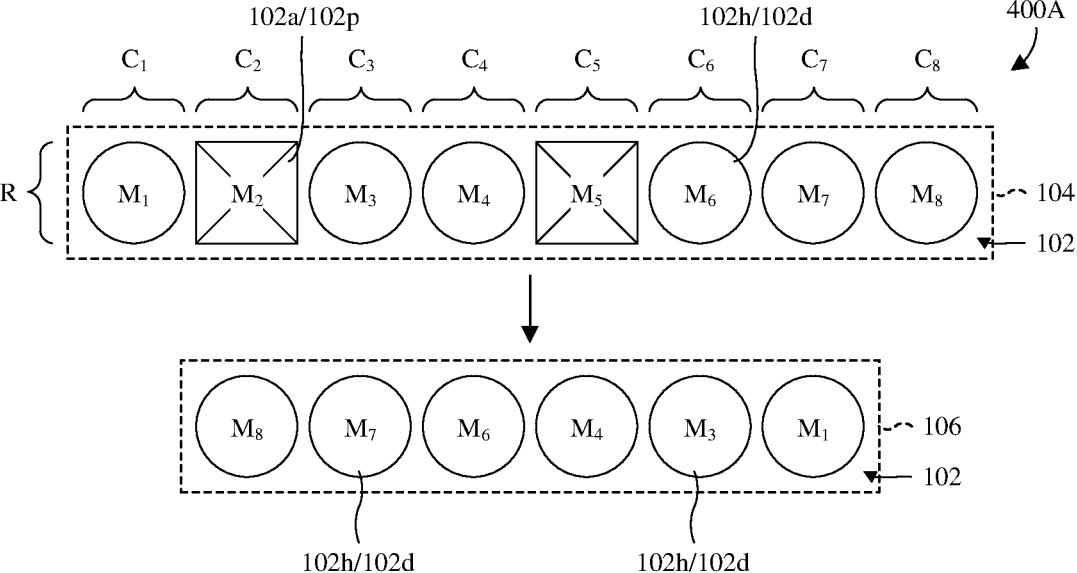
FIGS. 4A and 4B illustrate schematic diagrams of some different alternative embodiments of the LUT-free dynamic memory allocation process of FIG. 1.
Figure 4B:
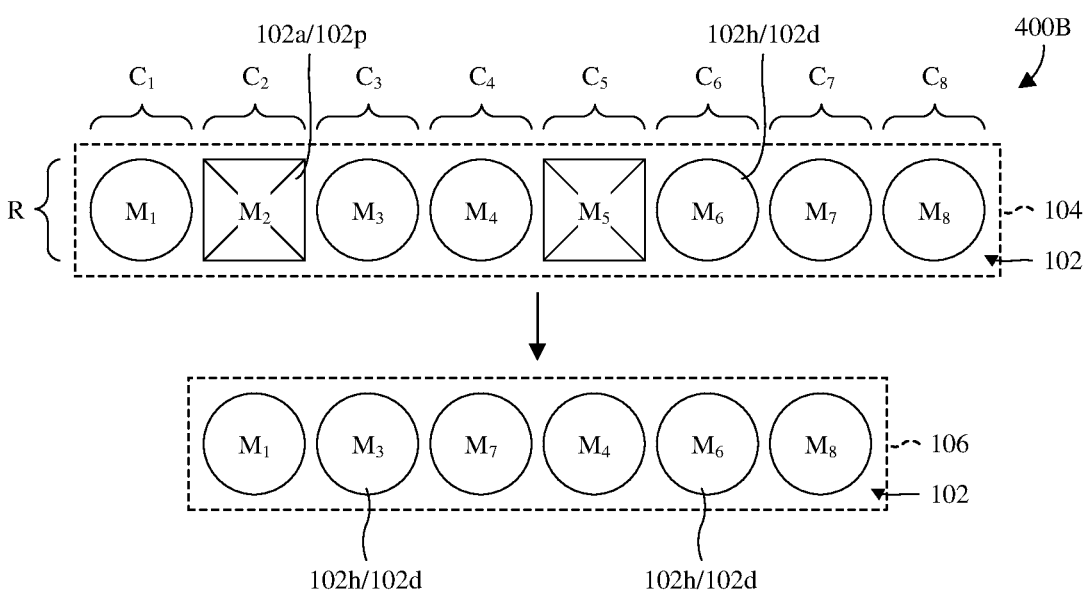

With reference to FIGS. 4A and 4B, schematic diagrams 400A, 400B of some different embodiments of the LUT-free dynamic memory allocation process of FIG. 1 are provided using different allocation schemes. In both allocation schemes illustrated by FIGS. 4A and 4B, the first and last allocated memory cells correspond to the leftmost bit of the logical word 106 and the rightmost bit of the logical word 106.

In FIG. 4A, healthy memory cells 102h are dynamically allocated to the logical word 106 from right to left while excluding abnormal memory cells 102a flagged with the permanent state. Hence, an ordering of the healthy memory cells 102h for the logical word 106 is reversed compared to an ordering of the healthy memory cells 102h for the physical word 104. In FIG. 4B, healthy memory cells 102h at odd numbered columns (e.g., memory cells M₁, M₃, and M₇) are first dynamically allocated to the logical word 106 from left to right while excluding abnormal memory cells 102a flagged with the permanent state. Healthy memory cells 102h at even numbered columns (e.g., memory cells M₄, M₆, and M₈) are then dynamically allocated to the logical word 106 from left to right while excluding abnormal memory cells 102a flagged with the permanent state. In alternative embodiments, other allocation schemes are employed.

Figure 5:
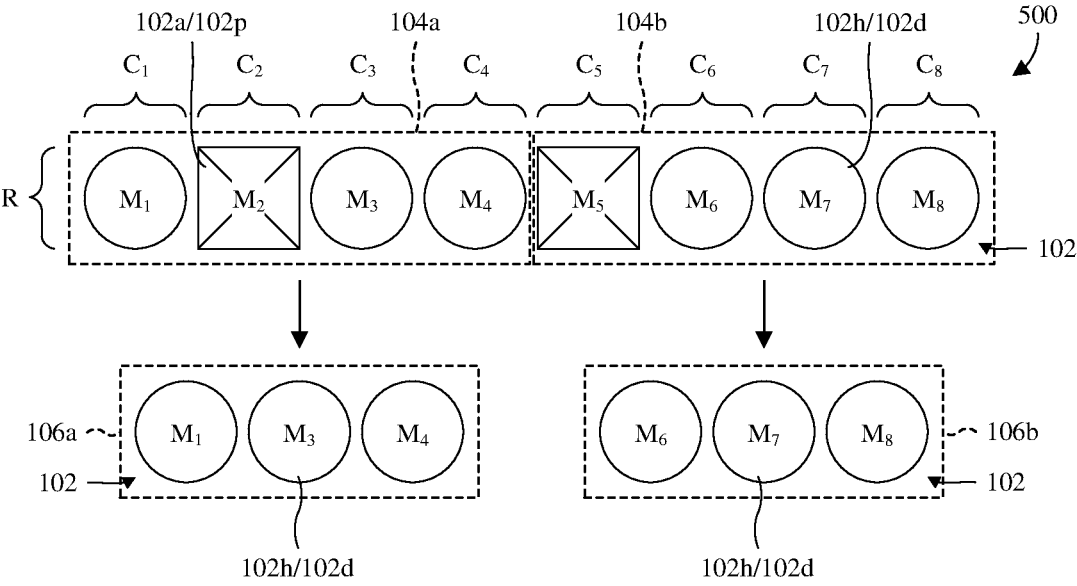
FIG. 5 illustrates a schematic diagram of some embodiments of the LUT-free dynamic memory allocation process of FIG. 1 in which the row is configured to store multiple physical words.

With reference to FIG. 5, a schematic diagram 500 of some embodiments of the LUT-free dynamic memory allocation process of FIG. 1 is provided in which the row R is configured to store multiple physical words: a first physical word 104a; and a second physical word 104b. The multiple physical words have the same number of bits as each other and the same layout of data as each other. For example, the first and second physical words 104a, 104b may each have 4 bits of data as illustrated or may have some other suitable number of bits. In alternative embodiments, the row R is configured to store additional physical words arranged along the row R.

When applying the LUT-free dynamic memory allocation process, dynamic allocation is performed individually by physical word. For example, dynamic allocation is performed on the memory cells corresponding to the first physical word 104a independent of the memory cells corresponding to the second physical word 104b and vice versa. By applying the LUT-free dynamic memory allocation process individually by physical word, memory cells corresponding to the physical words are dynamically allocated to logical words individual to the corresponding physical words. For example, memory cells corresponding to the first physical word 104a are dynamically allocated to a first logical word 106a individual to the first physical word 104a. As another example, memory cells corresponding to the second physical word 104b are dynamically allocated to a second logical word 106b individual to the second physical word 104b.

The dynamic allocation for a logical word is performed as described with regard to FIG. 1. Healthy and abnormal memory cells corresponding to a physical word are identified using the permanent state of the memory cells 102 to discriminate between healthy memory cells 102h and abnormal memory cells 102a. The memory cells identified as being healthy memory cells 102h, but not the memory cells identified as being abnormal memory cells 102a, are then dynamically allocated from left to right to the logical word. For example, memory cell M₂ is identified as being abnormal because it is a permanent memory cell 102p and is therefore skipped while memory cells are dynamically allocated to the first logical word 106a.

Figure 6:
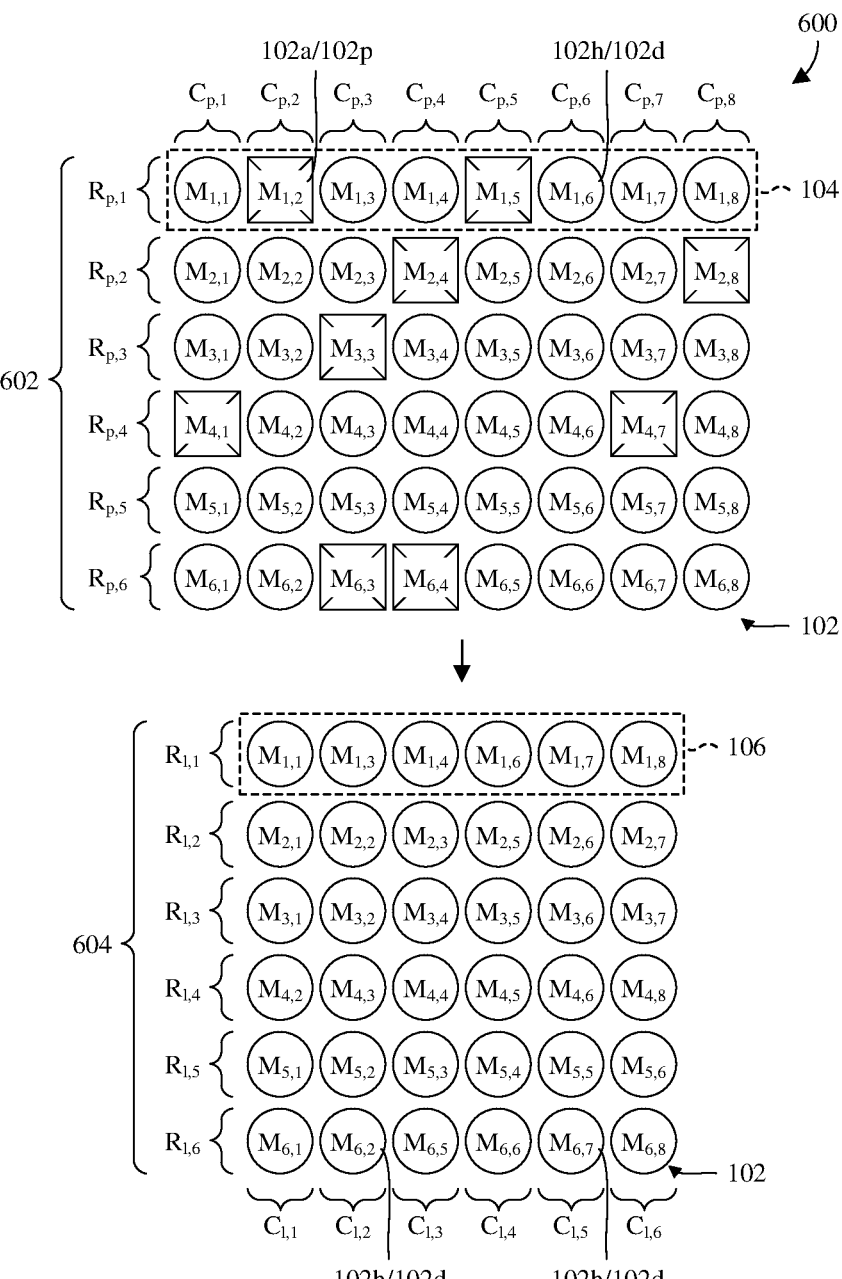
FIG. 6 illustrates a schematic diagram of some embodiments of the LUT-free dynamic memory allocation process of FIG. 1 for an array of memory cells.

With reference to FIG. 6, a schematic diagram 600 of some embodiments of the LUT-free dynamic memory allocation process of FIG. 1 for a physical memory array 602 is provided. The physical memory array 602 comprises a plurality of memory cells 102 in a plurality of rows and a plurality of columns. The memory cells 102 are individually labeled $M_{<row\ number>,<column\ number>}$, the rows are individually labeled $R_{p,<row\ number>}$, and the columns are individually labeled $C_{p,<column\ number>}$. Within the subscripts for these labels, "row number" and "column number" are integers respectively identifying a specific row and a specific column.

The rows of the physical memory array 602 are each as the row R of FIG. 1 is described but may have different numbers and arrangements of healthy and abnormal memory cells 102h, 102a. For example, row $R_{p,1}$ is the same as the row R of FIG. 1, whereas a remainder of the rows have different numbers and arrangements of healthy and abnormal memory cells 102h, 102a. Further, each row of the physical memory array 602 is configured to store a physical word 104. For example, each row of the physical memory array 602 may be configured to store an 8-bit physical word. In alternative embodiments, each row of the physical memory array 602 is configured to store multiple physical words as described with regard to FIG. 5.

In advance of the LUT-free dynamic memory allocation process, abnormal memory cells 102a are identified and set to the permanent state as described with regard to FIG. 1. Further, during the LUT-free dynamic memory allocation process, healthy memory cells 102h are dynamically allocated to logical words 106 using the permanent state of the memory cells 102 to distinguish between healthy memory cells 102h and abnormal memory cells 102a. Dynamic allocation is performed individually for the rows of the physical memory array 602 as described with regard to FIG. 1. Further, to the extent that the physical memory array 602 is configured to store multiple physical words per row, dynamic allocation is performed individually by physical word as described with regard to FIG. 5. By performing dynamic allocation on each of the rows of the physical memory array 602, a logical memory array 604 may be defined.

The logical memory array 604 comprises a plurality of rows and a plurality of columns. The rows are individually labeled $R_{1,<row\ number>}$, and the columns are individually labeled $C_{1,<column\ number>}$, where "row number" and "column number" are integers respectively identifying a specific row and a specific column. The rows of the logical memory array 604 are the same as the rows of the physical memory array 602. On the other hand, associations between the columns of the logical memory array 604 and the columns of the physical memory array 602 may vary across the rows of the logical memory array 604 depending on numbers and arrangements of abnormal memory cells 102a in the rows of the physical memory array 602. For example, as illustrated, each row of the logical memory array 604 has a different association between the columns of the logical memory array 604 and the columns of the physical memory array 602.

Figure 7A:
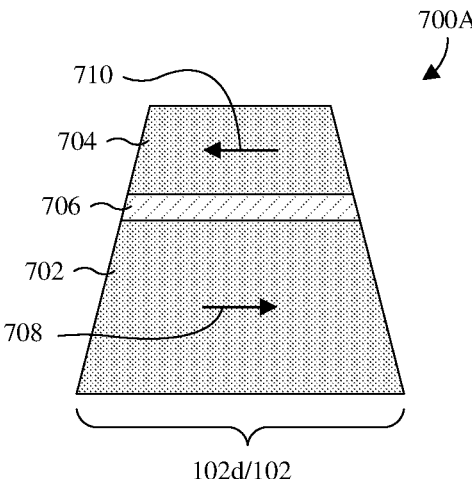
FIGS. 7A and 7B illustrate cross-sectional views of some embodiments of a memory cell in FIG. 1 in which the memory cell is an MRAM cell respectively in a first data state and a second data state.
Figure 7B:
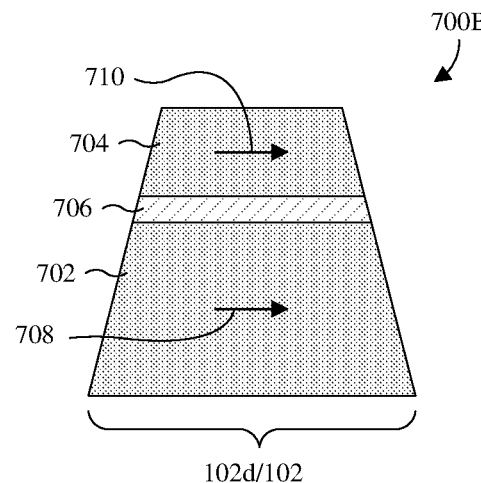

With reference to FIGS. 7A and 7B, cross-sectional views 700A, 700B of some embodiments of a memory cell 102 in FIG. 1 is provided in which the memory cell 102 is an MRAM cell respectively in a first data state and a second data state. Hence, the memory cell 102 may also be known as a data memory cell 102d. In FIG. 7A, the memory cell 102 is in the first data state and may, for example, be representative of each memory cell 102 of FIG. 1 in the first data state. In FIG. 7B, the memory cell 102 is in the second data state and may, for example, be representative of each memory cell 102 of FIG. 1 in the second data state.

The memory cell 102 comprises a reference element 702, a free element 704, and a barrier element 706 collectively defining a magnetic tunnel junction (MTJ). The reference and free elements 702, 704 are ferromagnetic and are vertically stacked with the free element 704 overlying the reference element 702. Further, the reference element 702 has a magnetization 708 that is fixed, whereas the free element 704 has a magnetization 710 that is "free" to change. Note that the magnetizations 708, 710 are schematically illustrated by arrows. Further, note that while the magnetizations 708, 710 are illustrated as being horizontal, the magnetizations 708, 710 (and hence the arrows) may alternatively be vertical. This may, for example, arise in alternative embodiments of the memory cell 102 in which the MTJ is a perpendicular MTJ. The barrier element 706 is non-magnetic and is sandwiched between the reference and free elements 702, 704.

During operation, the barrier element 706 selectively allowing quantum mechanical tunneling of electrons through the barrier element 706. When the magnetizations 708, 710 of the reference and free elements 702, 704 are antiparallel, as illustrated in FIG. 7A, quantum mechanical tunneling may be blocked. As such, the data memory cell 102d may have a high resistance and may be in the first data state. When the magnetizations 708, 710 of the reference and free elements 702, 704 are parallel, as illustrated in FIG. 7B, quantum mechanical tunneling may be allowed. As such, the data memory cell 102d may have a low resistance and may be in the second data state.

The barrier element 706 may, for example, be or comprise an amorphous barrier, a crystalline barrier, or some other suitable insulating and/or tunnel barrier material. The amorphous barrier may be or comprise, for example, aluminum oxide (e.g., $AlO_x$), titanium oxide (e.g., $TiO_x$), or some other suitable amorphous barrier. The crystalline barrier may, for example, be or comprise manganese oxide (e.g., MgO), spinel (e.g., $MgAl_2O_4$), or some other suitable crystalline barrier. The reference element 702 and/or the free element 704 may, for example, be or comprises cobalt iron (e.g., CoFe), cobalt iron boron (e.g., CoFeB), some other suitable ferromagnetic material(s), or any combination of the foregoing.

Figure 8A:
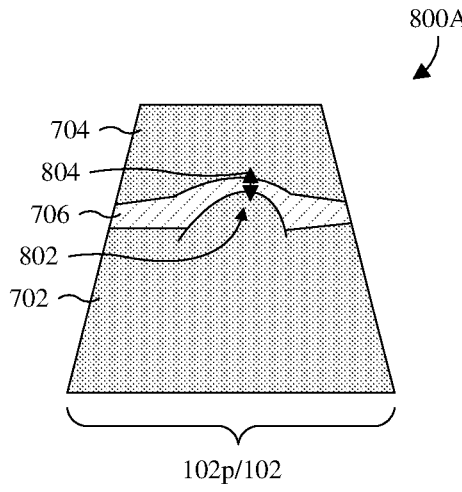
FIGS. 8A and 8B illustrate cross-sectional views of some different embodiments of a memory cell in FIG. 1 in which the memory cell is an MRAM cell in a permanent state.
Figure 8B:
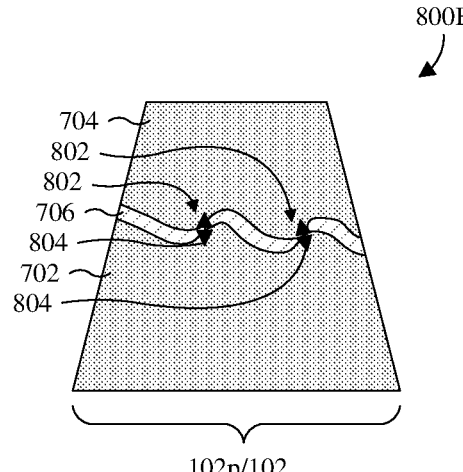

With reference to FIGS. 8A and 8B, cross-sectional views 800A, 800B of some different embodiments of a memory cell 102 in FIG. 1 is provided in which the memory cell 102 is an MRAM cell in a permanent state. Hence, the memory cell 102 may also be known as a permanent memory cell 102p. The memory cell 102 may, for example, be representative of each memory cell 102 of FIG. 1 in the permanent state.

The memory cell 102 comprises a reference element 702, a free element 704, and a barrier element 706 as in FIGS. 7A and 7B. However, compared to the barrier element 706 in FIGS. 7A and 7B, the barrier element 706 in FIGS. 8A and 8B has an abnormal structure. As part of the abnormal structure, the barrier element 706 comprises one or more defects 802 defining one or more leakage paths 804 from the reference element 702 to the free element 704. The defect(s) 802 may, for example, be or comprise carrier traps, conductive filaments, some other suitable defect(s), or any combination of the foregoing.

With reference specifically to the cross-sectional view 800A of FIG. 8A, the barrier element 706 is missing material at a location where the reference element 702 bulges upward. Further, a leakage path 804 extends between the reference and free elements 702, 704 at the bulge. The barrier element 706 may, for example, be missing material and/or have the leakage path 804 due to a hard breakdown. As such, a defect 802 defining the leakage path 804 may, for example, be or comprise a conductive filament in the barrier element 706.

With reference specifically to the cross-sectional view 800B of FIG. 8B, the barrier element 706 is twisted, thereby resulting in a non-uniform thickness. Further, leakage paths 804 extend between the reference and free elements 702, 704 at thin regions of the barrier element 706. The barrier element 706 may, for example, be twisted and/or have the leakage paths 804 due to a soft breakdown. As such, defects 802 defining the leakage paths 804 may, for example, be or comprise carrier traps in the barrier element 706.

While FIGS. 7A, 7B, 8A, and 8B illustrate the reference element 702 and the free element 704 as being respectively under and over the barrier element 706, the reference element 702 and the free element 704 may alternatively be respectively over and under the barrier element 706. While FIGS. 7A, 7B, 8A, and 8B illustrate the memory cells 102 of FIG. 1 as MRAM cells, the memory cells 102 of FIG. 1 may be other suitable types of memory cells having at least two data states and at least one permanent state. For example, the memory cells 102 of FIG. 1 may be RRAM cells, FeRAM cells, other suitable types of MRAM cells, and so on. While FIGS. 7A, 7B, 8A, and 8B illustrate the memory cells 102 of FIG. 1 as MRAM cells, the memory cells 102 of FIG. 1 may alternatively be 1S1R memory cells. For example, a selector may be stacked with the reference element 702, the free element 704, and the barrier element 706 in alternative embodiments of FIGS. 7A, 7B, 8A, and 8B.

Figure 9:
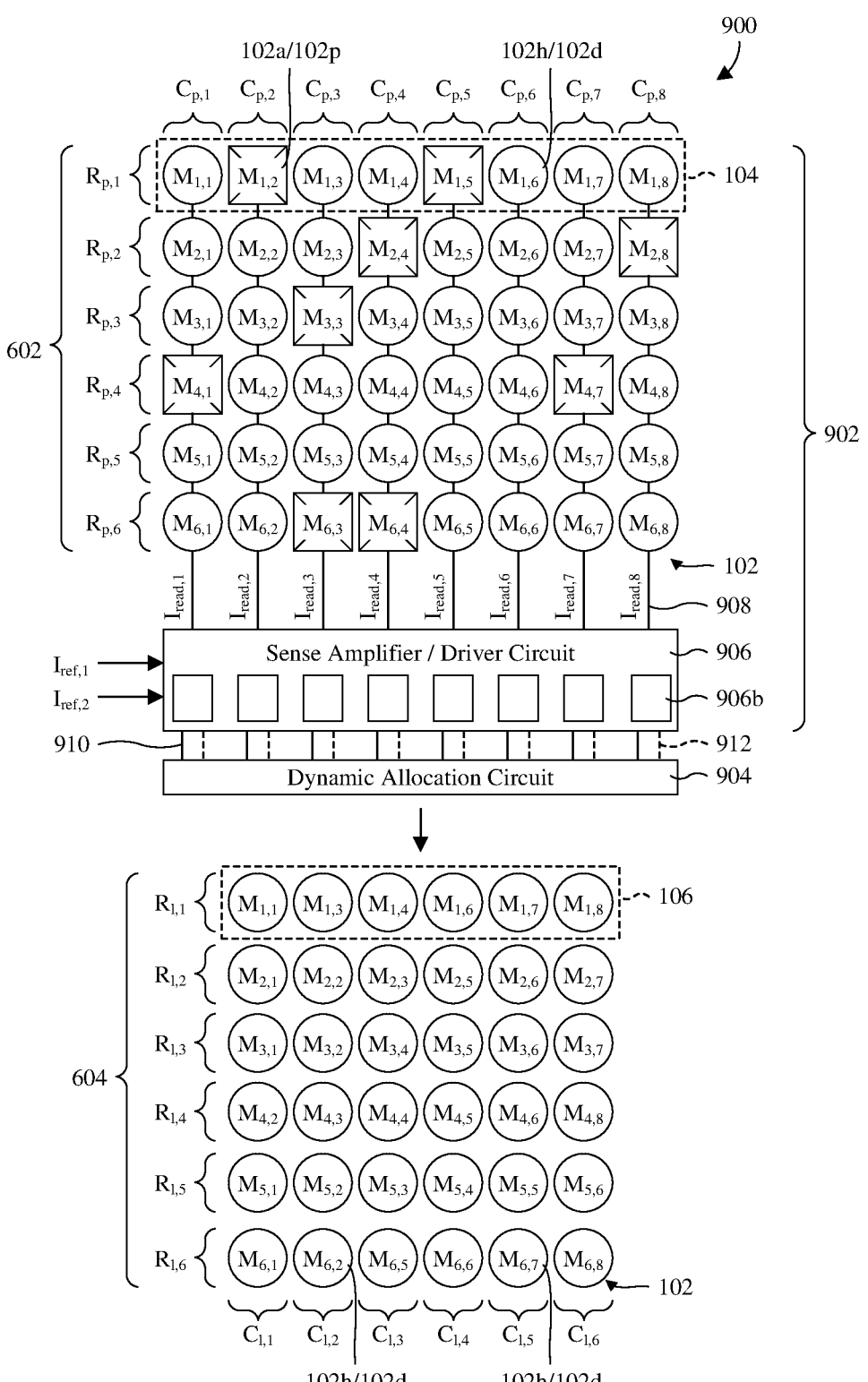
FIG. 9 illustrates a schematic diagram of some embodiments of an integrated circuit (IC) chip configured to perform the LUT-free dynamic memory allocation process of FIG. 1.

With reference to FIG. 9, a schematic diagram 900 of some embodiments of an IC chip comprising a memory core 902 and a dynamic allocation circuit 904 is provided. The memory core 902 comprises a physical memory array 602 and a sense amplifier/driver circuit 906. The sense amplifier/ driver circuit 906 coordinates with the dynamic allocation circuit 904 to translate the physical memory array 602 to a logical memory array 604 according to the LUT-free dynamic memory allocation process described with regard to FIGS. 1 and 6. The physical memory array 602 and the logical memory array 604 are as in FIG. 6, but other suitable configurations of the physical and logical memory arrays 602, 604 are amenable in alternative embodiments.

During the LUT-free dynamic memory allocation process, a single row of the physical memory array 602 is selected by a corresponding word line (not shown). Further, memory cells corresponding to a physical word 104 in the selected row may be biased with a read voltage by conductive lines 908 (only some of which are shown) extending along the columns. As a result, read currents individual to the memory cells in the selected row are generated on the conductive lines 908. The read currents are individually labeled $I_{read,<column number>}$, where the column number is an integer identifying a specific column in the physical memory array 602.

The sense amplifier/driver circuit 906 is electrically coupled to the physical memory array 602 by the conductive lines 908 and receives the read currents. Further, the sense amplifier/driver circuit 906 receives a first reference current $I_{ref,1}$ and a second reference current $I_{ref,2}$. The first reference current $I_{ref,1}$ is between the read current of the memory cells 102 when in a first data state and the read current of the memory cells 102 when in a second data state. Further, the second reference current $I_{ref,2}$ is between the read current of the memory cells 102 when in a permanent state and the read currents of the memory cells 102 when in the first and second data states. The sense amplifier/driver circuit 906 comprises a plurality of sense amplifier blocks 906*b*. The sense amplifier blocks 906*b* are individual to the columns of the physical memory array 602 and compare the read currents to the first and second reference currents $I_{ref,1}$, $I_{ref,2}$.

By comparing the read currents to the first reference current $T_{ref,1}$, the sense amplifier blocks 906*b* generate corresponding read data signals. The read data signals are binary signals individual to the read currents and hence individual to the memory cells 102 in the selected row. For example, a read data signal may have a value of "1" if the corresponding read current is less than the first reference current $I_{ref,1}$, and may have a value of "0" if the corresponding read current is greater than the first reference current $I_{ref,1}$, or vice versa. Further, because the first reference current $T_{ref,1}$ is between the read current of the memory cells 102 when in the first data state and the read current of the memory cells 102 when in the second data state, the read data signals represent the data states of the memory cells 102 in the selected row. Further, the read data signals represent the physical word 104 as read from the memory cells 102 in the selected row.

By comparing each of the read currents to the second reference current $I_{ref,2}$, the sense the sense amplifier blocks 906*b* generate corresponding read flag signals. The read flag signals are binary signals individual to the read currents and hence individual to the memory cells 102 in the selected row. For example, a read flag signal may have a value of "1" if the corresponding read current is less than the second reference current $I_{ref,2}$, and may have a value of "0" if the corresponding read current is greater than the second reference current $I_{ref,2}$, or vice versa. Further, because the second reference current $I_{ref,2}$ is between the read current of the memory cells 102 when in the permanent state and the read currents of the memory cells 102 when in the first and second data states, the read flag signals may be used to distinguish between memory cells in the permanent state and memory cells in the data state. In some embodiments in which the permanent state has a lesser resistance than resistances of the first and second data states, a read flag signal identifies the permanent state if the read current $I_{read}$ is greater than the second reference current $I_{ref,2}$ and otherwise identifies the first or second data state. In some embodiments in which the permanent state has a greater resistance than resistances of the first and second data states, a read flag signal identifies the permanent state if the read current $I_{read}$ is less than the second reference current $I_{ref,2}$ and otherwise identifies the first or second data state.

The dynamic allocation circuit 904 is electrically coupled to the sense amplifier/driver circuit 906 and receives the read data signals and the read flag signals by corresponding data lines 910 and flag lines 912. For clarity, the data lines 910 are schematically illustrated as solid lines, whereas the flag lines 912 are schematically illustrated as dashed lines. Using the read flag signals, the dynamic allocation circuit 904 identifies which of the memory cells 102 in the selected row are in the first and second data states and which of the memory cells 102 in the selected row are in the permanent state. Memory cells identified as being in the first and second data states are then dynamically allocated to a logical word 106 while excluding memory cells identified as being in permanent states. Further, the memory cells dynamically allocated to the logical word 106 are then employed for read and write operations. In the case of a read operation, this may involve outputting the read data signals for the allocated memory cells.

As above, abnormal memory cells 102*a* are identified and set to the permanent state in advance of the LUT-free dynamic memory allocation process, such that the permanent state flags the abnormal memory cells 102*a*. Therefore, memory cells identified as being in the first and second data states may also be regarded as healthy memory cells 102*h*, whereas memory cells identified as being in the permanent state may also be regarded as abnormal memory cells 102*a*. Additionally, as above, the LUT-free dynamic memory allocation process is performed during read and write operations to allocate healthy memory cells 102*h*, but not abnormal memory cells, to logical words 106. The logical words 106 are then read from, or written to, the healthy memory cells 102*h*. Hence, the LUT-free dynamic memory allocation process may facilitate avoidance of abnormal memory cells 102*a* during read and write operations.

By generating read currents individually for each row of the physical memory array 602, and by performing the LUT-free dynamic memory allocation process individually for each row of the physical memory array 602, the logical memory array 604 may be derived from the physical memory array 602. As described at FIG. 6, the rows of the logical memory array 604 are the same as the rows of the physical memory array 602. However, associations between the columns of the logical memory array 604 and the columns of the physical memory array 602 may vary across the rows of the logical memory array 604 depending on numbers and arrangements of abnormal memory cells 102*a* in the rows of the physical memory array 602. In some embodiments, the healthy memory cells 102*h* in row $R_{p,1}$ respectively store 1, 0, 1, 1, 0, 1, where 1 and 0 correspond to the first and second data states. Other suitable values are, however, amenable.

With reference to FIG. 10A, a graph 1000A of some embodiments of a plurality of read current probability distributions 1002 corresponding to the different states of the memory cells 102 of FIG. 9 is provided. The horizontal axis corresponds to read current, and the vertical axis corresponds to probability. As discussed above, the different states include a first data state, a second data state, and a permanent state.

The plurality of read current probability distributions 1002 includes a first data state distribution $I_{d1}$, a second data state distribution $I_{d2}$, and a permanent state distribution $I_p$ that correspond to the first data state, the second data state, and the permanent state. The first data state distribution $I_{d1}$ has a lower current than the second data state distribution $I_{d2}$. As such, a memory cell in the first data state has a higher resistance than a memory cell in the second data state have. Further, the permanent state distribution $I_p$ has a higher current than the second data state distribution $I_{d2}$. As such, a memory cell in the permanent state has a lower resistance than a memory cell in the second data state. The first data state distribution $I_{d1}$ is representative of any of the memory cells 102 of FIG. 9 in the first data state, and the second data state distribution $I_{d2}$ is representative of any of the memory cells 102 of FIG. 9 in the second data state. Further, the permanent state distribution $I_p$ is representative of any of the memory cells 102 of FIG. 9 in the permanent state.

A first reference current $I_{ref,1}$ is at a center of a read window 1004 for the first and second data states, and a second reference current $I_{ref,2}$ is at a center of a flag window 1006 for the second data state and the permanent state. In alternative embodiments, the first reference current $I_{ref,1}$ is in the read window 1004, but is offset from the center of the read window 1004. Similarly, in alternative embodiments, the second reference current $I_{ref,2}$ is in the flag window 1006, but is offset from the center of the flag window 1006. The first reference current $T_{ref,1}$ is used by the sense amplifier/driver circuit 906 of FIG. 9 to determine whether a memory cell is in the first data state or the second data state. The second reference current $I_{ref,2}$ is used by the sense amplifier/driver circuit 906 of FIG. 9 to determine whether a memory cell is in a data state (e.g., the first or second data state) or the permanent state.

With reference to FIG. 10B, a graph 1000B of some alternative embodiments of the plurality of read current probability distributions 1002 of FIG. 10A is provided in which the permanent state distribution $I_p$ is less than the first and second data state distributions $I_{d1}$, $I_{d2}$. Hence, the flag window 1006 is from the permanent state distribution $I_p$ to the first data state distribution $I_{d1}$ and the second reference current $I_{ref,2}$ is less than the first reference current $I_{ref,1}$. Further, the permanent state has a higher resistance than resistances of the first and second data states.

With reference to FIGS. 11A and 11B, schematic diagrams 1100A, 1100B of some embodiments of a sense amplifier block 906b of FIG. 9 is provided in which the sense amplifier block 906b is electrically coupled to a memory cell 102 respectively in a data state and a permanent state. In FIG. 11A, the memory cell 102 is in a data state (e.g., a first data state or a second data state) and is hence schematically illustrated as a circle. In FIG. 11B, the memory cell 102 is in a permanent state and is hence schematically illustrated as a square.

The sense amplifier block 906b is representative of each of the sense amplifier blocks 906b in FIG. 9 and comprises a first sense amplifier 1102 and a second sense amplifier 1104. The first and second sense amplifiers 1102, 1104 receive a read current $I_{read}$ from the memory cell 102 from a conductive line 908 (e.g., a bit or source line). The first sense amplifier 1102 further receives the first reference current $I_{ref,1}$ from a corresponding conductive line (not labeled) and compares the first reference current $I_{ref,1}$ to the read current $I_{read}$ to generate a read data signal $S_{rd}$ on a data line 910. The read data signal $S_{rd}$ may, for example, be a binary signal. Further, the read data signal $S_{rd}$ may indicate a logic "1" if the read current $I_{read}$ exceeds the first reference current $T_{ref,1}$, and may otherwise indicate a logic "0", or vice versa. The second sense amplifier 1104 further receives the second reference current $I_{ref,2}$ from a corresponding conductive line (not labeled) and compares the second reference current $I_{ref,2}$ to the read current $I_{read}$ to generate a read flag signal $S_{rf}$ on a flag line 912. The read flag signal $S_{rf}$ may, for example, be a binary signal. Further, the read flag signal $S_{rf}$ may indicate a logic "1" if the read current $I_{read}$ exceeds the second reference current $I_{ref,2}$, and may otherwise indicate a logic "0", or vice versa. As described with regard to FIG. 9, the read data signal $S_{rd}$ and the read flag signal $S_{rf}$ are used by the LUT-free dynamic memory allocation process for dynamic allocation.

In some embodiments in which the permanent state has a lesser resistance than resistances of the first and second data states, the read flag signal $S_{rf}$ identifies the permanent state if the read current $I_{read}$ is greater than the second reference current $I_{ref,2}$ (see, e.g., FIG. 10A) and otherwise identifies the first or second data state. In some embodiments in which the permanent state has a greater resistance than resistances of the first and second data states, the read flag signal $S_{rf}$ identifies the permanent state if the read current $I_{read}$ is less than the second reference current $I_{ref,2}$ (see, e.g., FIG. 10B) and otherwise identifies the first or second data state.

Figure 12:
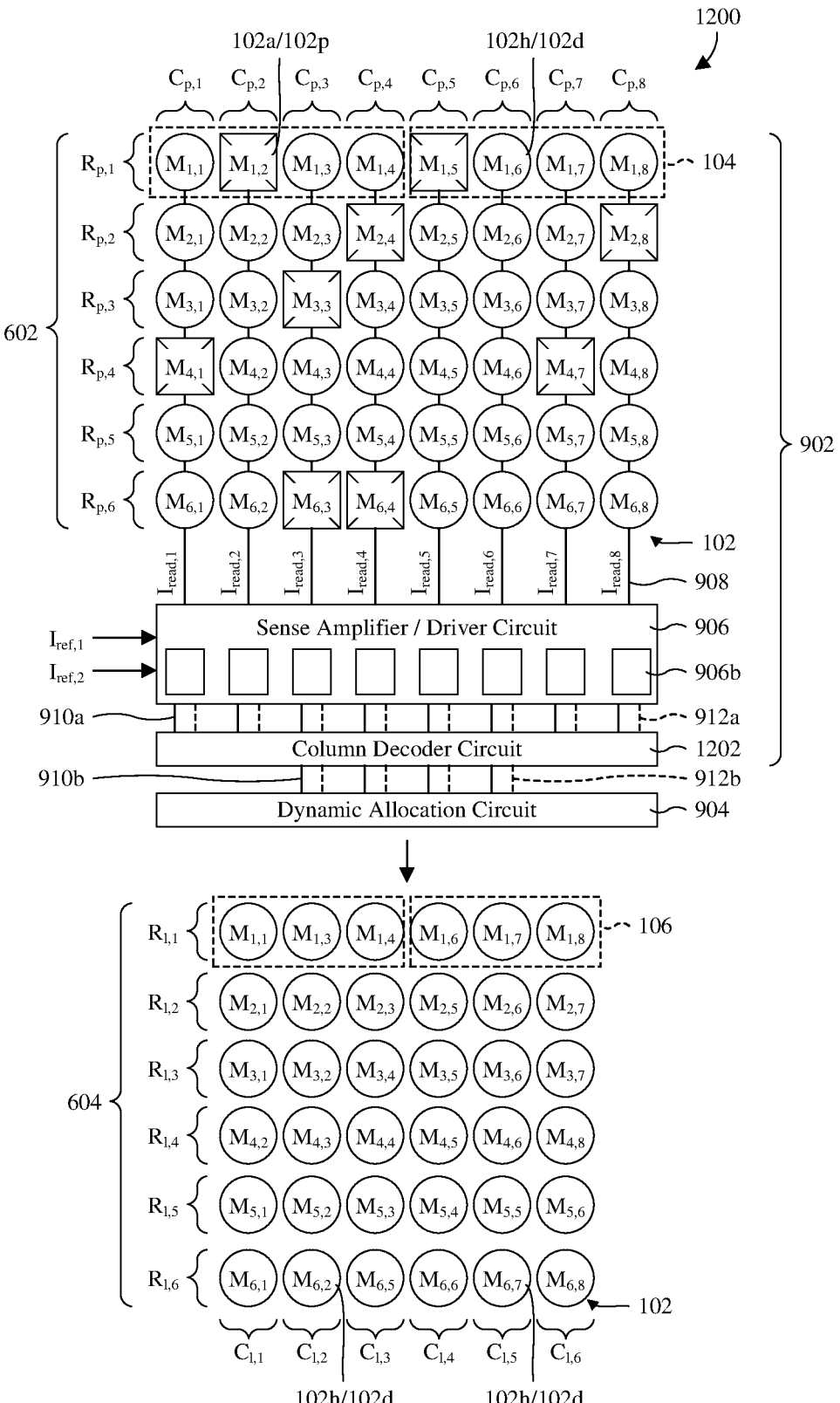
FIG. 12 illustrates a schematic diagram of some alternative embodiments of the IC chip of FIG. 9 in which a column decoder is between a sense amplifier/driver circuit and a dynamic allocation circuit.

With reference to FIG. 12, a schematic diagram 1200 of some alternative embodiments of the IC chip of FIG. 9 is provided in which the physical memory array 602 is configured to store multiple physical words 104 per row and the memory core 902 further comprises a column decoder 1202 between the dynamic allocation circuit 904 and the sense amplifier/driver circuit 906. The column decoder 1202 is employed to select the read data and flag signals for memory cells corresponding to a single physical word and to pass the selected read data and flag signals to the dynamic allocation circuit 904 for LUT-free dynamic allocation. As described above with regard to FIG. 5, LUT-free dynamic allocation is performed individually by physical word.

The column decoder 1202 is electrically coupled to the sense amplifier/driver circuit 906 and receives the read data and flag signals from the sense amplifier/driver circuit 906 respectively over first data lines 910a and first flag lines 912a. Further, the column decoder 1202 is electrically coupled to the dynamic allocation circuit 904 and selectively passes read data and flag signals to the dynamic allocation circuit 904 respectively over second data lines 910b and second flag lines 912b. For clarity, the first and second data lines 910a, 910b are schematically illustrated as solid lines, and the first and second flag lines 912a, 912b are schematically illustrated as dashed lines. In alternative embodiments, the column decoder 1202 is between the sense amplifier/driver circuit 906 and the physical memory array 602. In such alternative embodiments, the column decoder 1202 employed to select the conductive lines 908 for memory cells corresponding to a single physical word and to electrically couple the sense amplifier/driver circuit 906 to the selected conductive lines.

Figure 13:
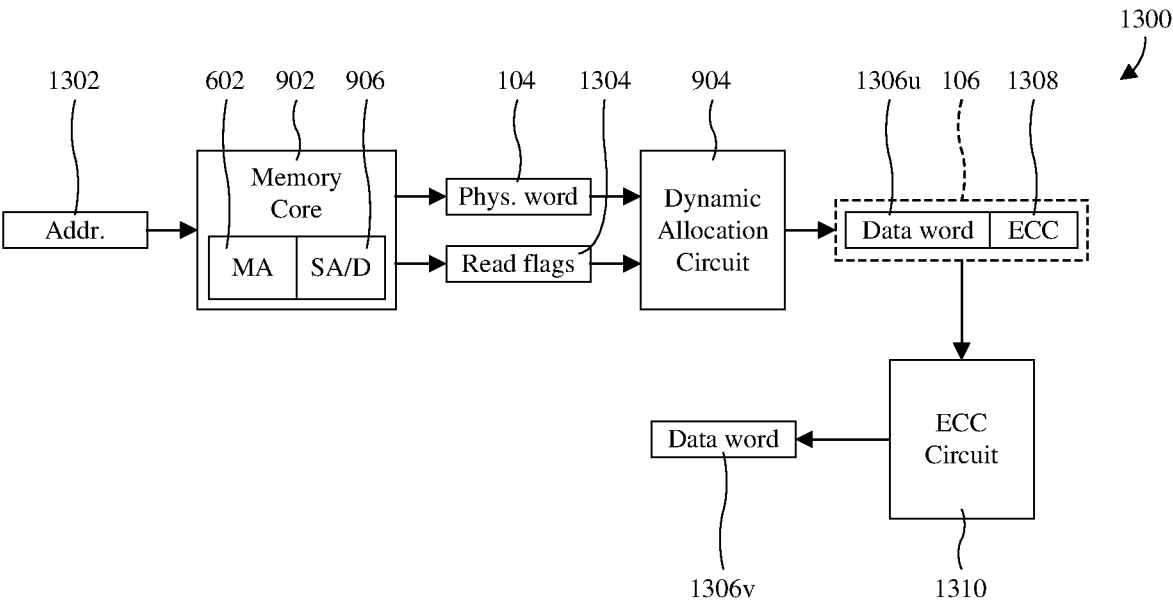
FIG. 13 illustrates a schematic flow diagram of some embodiments of the IC chip of FIG. 9 during a read operation.

With reference to FIG. 13, a schematic flow diagram 1300 of some embodiments of the IC chip of FIG. 9 during a read operation with ECC is provided. The memory core 902 receives an address 1302 identifying a row within the physical memory array 602. The identified row is selected, and the memory cells in the selected row are biased with a read voltage to generate read currents (e.g., $I_{read,1}$-$I_{read,8}$ in FIG. 9). The sense amplifier/driver circuit 906 compares the read currents individually to a first reference current (e.g., $I_{ref,1}$ in FIG. 9) and a second reference current (e.g., $I_{ref,2}$ in FIG. 9) to respectively generate a physical word 104 and read flags 1304. The physical word 104 corresponds to the read data signals carried on the data lines 910 of FIG. 9, whereas the read flags 1304 correspond to the read flag signals carried on the flag lines 912 of FIG. 9.

The dynamic allocation circuit 904 receives the physical word 104 and the read flags 1304 from the memory core 902. Further, the dynamic allocation circuit 904 performs dynamic allocation using the physical word 104 and the read flags 1304. Particularly, the dynamic allocation circuit 904 identifies which of the memory cells 102 in the selected row are in a data state (e.g., the first or second data state) and which of the memory cells 102 in the selected row are in the permanent state using the read flags 1304 to discriminate between the data state and the permanent state. Because abnormal memory cells are set to the permanent state in advance, this practically translates to identifying which of the memory cells 102 in the selected row are healthy and which of the memory cells in the selected row are abnormal. Memory cells identified as being in the first and second data states are then dynamically allocated to a logical word 106 while excluding memory cells identified as being in the permanent state. Further, the physical word 104 is translated to a logical word 106 using the dynamic allocation. The logical word 106 includes an unverified data word 1306u and an ECC code 1308 for the unverified data word 1306u.

The physical word 104 includes a bit for each memory cell read and, as described above, includes more bits than the logical word 106 to allow for redundancy. The translation of the physical word 104 to the logical word 106 populates each bit location of the logical word 106 with the physical bit allocated to it by the dynamic allocation. For example, the first bit location of the logical word 106 may be populated with the second bit of the physical word 104 if the memory cell corresponding to the second bit of the physical word 104 is allocated to the first bit location of the logical word 106.

The ECC circuit 1310 receives the logical word 106 from the dynamic allocation circuit 904 and uses the ECC code 1308 to verify and, if necessary, to repair the unverified data word 1306u. The verification and repair may, for example, be performed using the Hamming code algorithm, the Reed-Solomon code algorithm, the Bose-Chaudhuri-Hoc-quenghem (BCH) code algorithm, or some other suitable ECC algorithm. In some embodiments, the unverified data word 1306u is 128 bits in length, the ECC code 1308 is 16 bits in length, and the ECC circuit 1310 is configured to repair up to 2 bits using the ECC code 1308. Other suitable bit lengths are, however, amenable in alternative embodiments. After verifying and, where necessary, repairing the unverified data word 1306u, a verified data word 1306v is output for consumption by the requesting entity (e.g., a central processing unit (CPU) or some other suitable entity). In alternative embodiments, the ECC code 1308 and the ECC circuit 1310 are omitted.

Figure 14A:
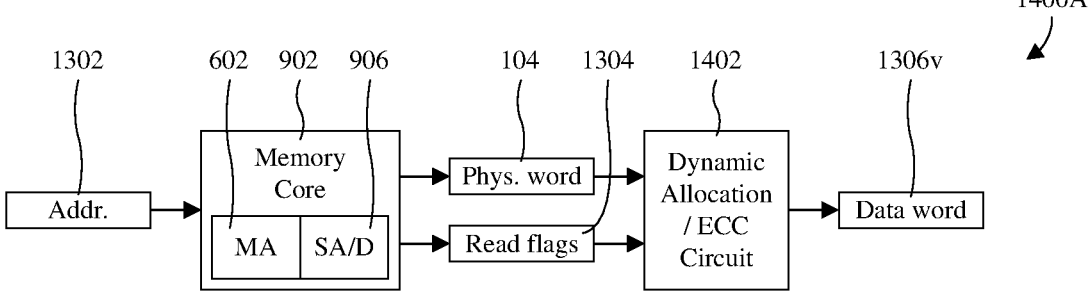
FIGS. 14A and 14B illustrate schematic flow diagrams of some different alternative embodiments of the IC chip of FIG. 13.

With reference to FIG. 14A, a schematic flow diagram 1400A of some alternative embodiments of the IC chip of FIG. 13 is provided in which the dynamic allocation circuit 904 and the ECC circuit 1310 are replaced with a dynamic allocation/ECC circuit 1402 that combines and implements the functions of the dynamic allocation circuit 904 and the functions of the ECC circuit 1310. The functions of the dynamic allocation circuit 904 and the functions of the ECC circuit 1310 may be combined because the functions may be performed by algorithmic calculations. By performing the functions of the dynamic allocation circuit 904 and the functions of the ECC circuit 1310 within a single circuit, the functions are implemented at the same IC chip area instead of at separate IC chip areas. This allows the overall IC chip area used to be reduced and further allows latency to be reduced because data is not being exchanged between separate IC chip areas.

Figure 14B:
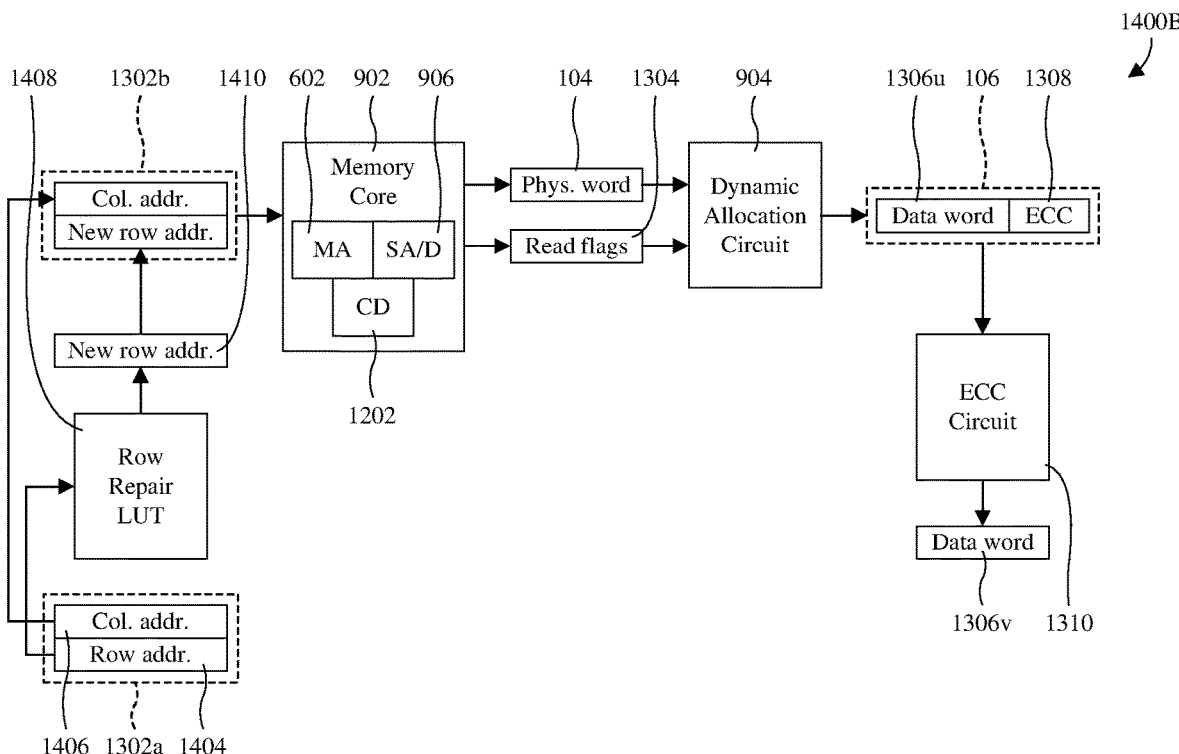

With reference to FIG. 14B, a schematic flow diagram 1400B of some alternative embodiments of the IC chip of FIG. 13 is provided in which the LUT-free dynamic memory allocation process is accompanied by a LUT-based memory allocation process. The LUT-based memory allocation process may, for example, be employed when the physical memory array 602 includes redundant rows for enhanced memory repair.

An original address 1302a is received and comprises an original row address 1404 and an original column address 1406. The original row address 1404 identifies a row in the physical memory array 602, and the original column address 1406 identifies a set of columns corresponding a physical word 104 within the identified row. The original row address 1404 is looked up in a row repair LUT 1408 that maps row addresses to the row addresses for redundant rows. The redundant rows may, for example, be reserved for rows of the physical memory array 602 with the most failed memory cells. To the extent that the original row address 1404 matches in the row repair LUT 1408, a new row address 1410 corresponding to a redundant row is output and combined with the original column address 1406 to form a new address 1302b. The schematic flow diagram 1400B then proceeds as described with regard to FIG. 13, except that: 1) the new address 1302b is used, if present, and the original address 1302a is otherwise used; and 2) a column decoder 1202 of the memory core 902 selects the set of columns identified by the original column address 1406 for the read operation as described with regard to FIG. 12. In alternative embodiments, the column decoder 1202 and the original column address 1406 are omitted.

Figure 15:
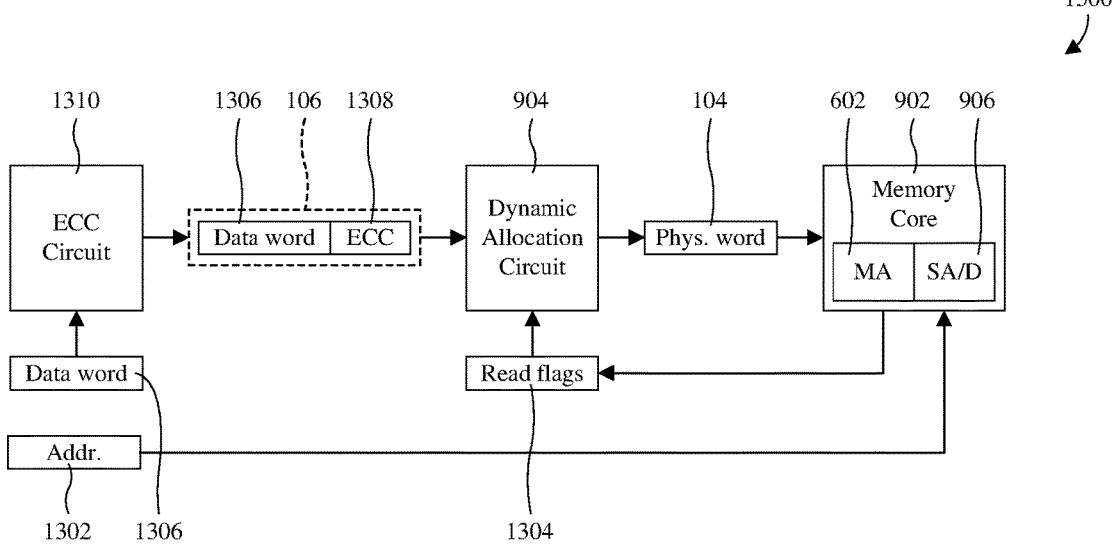
FIG. 15 illustrates a schematic flow diagram of some embodiments of the IC chip of FIG. 9 during a write operation.

With reference to FIG. 15, a schematic flow diagram 1500 of some embodiments of the IC chip of FIG. 9 during a write operation with ECC is provided. The memory core 902 receives an address 1302 identifying a row and subsequently reads the row as described with regard to FIGS. 9 and 13 to generate and output read flags 1304. In parallel with the read, an ECC circuit 1310 receives a data word 1306 to be written and subsequently generates an ECC code 1308 for the data word 1306. Further, the ECC circuit 1310 outputs a concatenation of the data word 1306 and the ECC code 1308 as a logical word 106. The ECC code 1308 may, for example, be generated by the Hamming code algorithm, the Reed-Solomon code algorithm, the BCH code algorithm, or some other suitable ECC algorithm.

The dynamic allocation circuit 904 receives the logical word 106 and the read flags 1304 respectively from the ECC circuit 1310 and the memory core 902. Further, the dynamic allocation circuit 904 identifies which of the memory cells 102 in the row identified by the address 1302 are in a data state (e.g., the first or second data state) and which of the memory cells 102 in the row are in the permanent state using the read flags 1304 to discriminate between the data state and a permanent state. Because abnormal memory cells are set to the permanent state in advance, this practically translates to identifying which of the memory cells 102 in the row are healthy and which of the memory cells in the row are abnormal. Memory cells identified as being in the first and second data states are then dynamically allocated to the logical word 106 while excluding memory cells identified as being in the permanent state. Additionally, the logical word 106 is translated to a physical word 104 using the dynamic allocation, and the physical word 104 is written to the address 1302 with the sense amplifier/driver circuit 906.

The physical word 104 includes a bit for each memory cell to be written and, as described above, includes more bits than the logical word 106 to allow for redundancy. The translation of the logical word 106 to the physical word 104 places each bit of the logical word 106 in the physical bit location allocated to it by the dynamic allocation. For example, the first bit of the logical word 106 may be placed in the second bit location of the physical word 104 if the memory cell corresponding to the second bit of the physical word 104 is allocated to the first bit of the logical word 106. Further, a remainder of the bit locations in the physical word 104 are unused and may hence be set to a logic "0" or a logic "1".

Figure 16A:
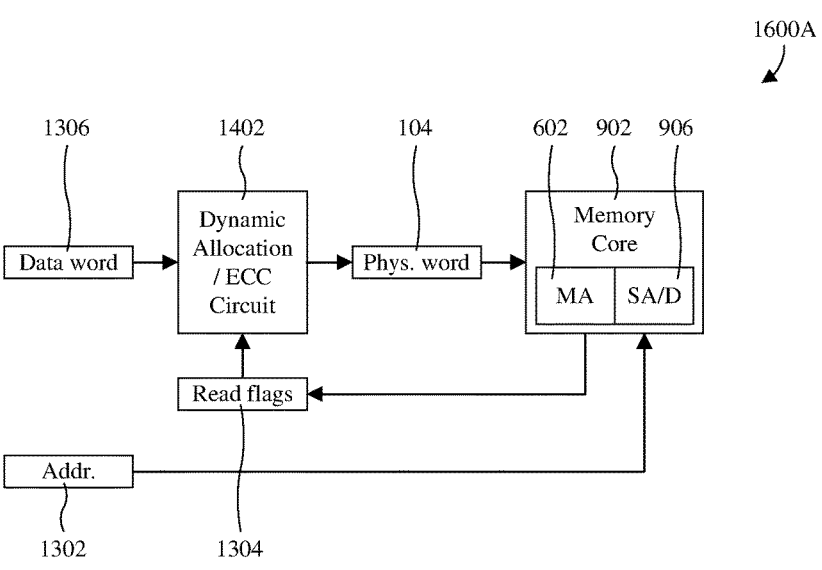
FIGS. 16A and 16B illustrate schematic flow diagram of some different alternative embodiments of the IC chip of FIG. 15.

With reference to FIG. 16A, a schematic flow diagram 1600A of some alternative embodiments of the IC chip of FIG. 15 is provided in which the dynamic allocation circuit 904 and the ECC circuit 1310 are replaced with a dynamic allocation/ECC circuit 1402 that combines and implements the functions of the dynamic allocation circuit 904 and the functions of the ECC circuit 1310. As described above with regard to FIG. 14A, this allows the overall IC chip area used to be reduced and further allows latency to be reduced.

Figure 16B:
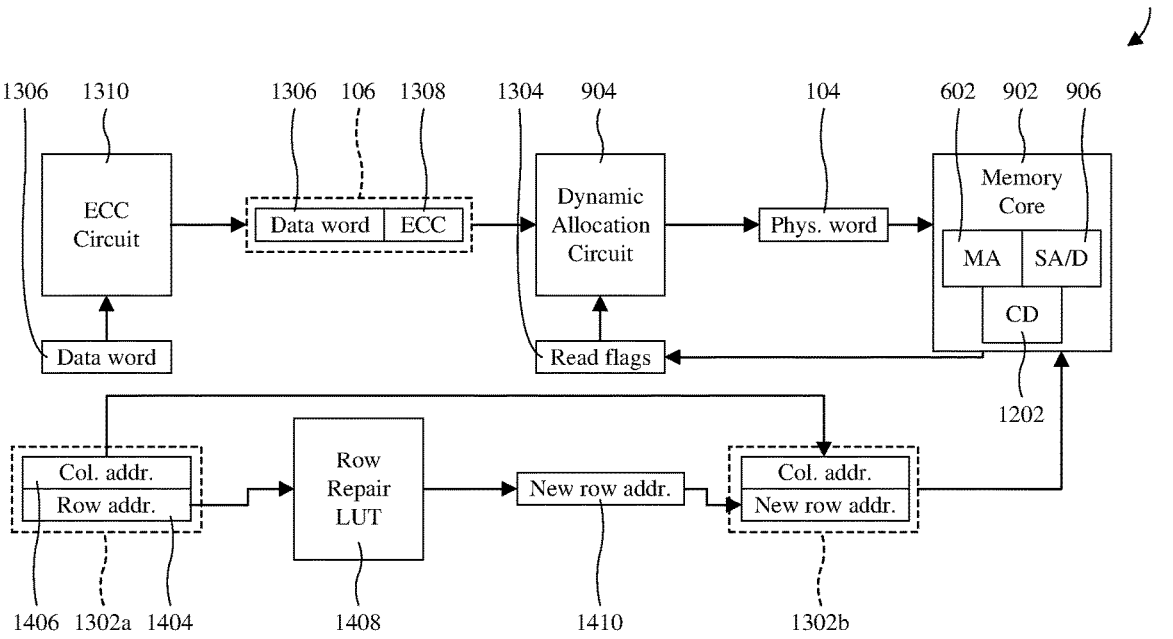

With reference to FIG. 16B, a schematic flow diagram 1600B of some alternative embodiments of the IC chip of FIG. 15 is provided in which the LUT-free dynamic memory allocation process is accompanied by a LUT-based memory allocation process. The LUT-based memory allocation process may, for example, be employed when the physical memory array 602 includes redundant rows for enhanced memory repair.

An original address 1302*a* is received and comprises an original row address 1404 and an original column address 1406. The original row address 1404 identifies a row in the physical memory array 602 and is looked up in a row repair LUT 1408 that maps row addresses to the row addresses for redundant rows. To the extent that the original row address 1404 matches in the row repair LUT 1408, a new row address 1410 corresponding to a redundant row is output and combined with the original column address 1406 to form a new address 1302*b*. The schematic flow diagram 1600B then proceeds as described with regard to FIG. 15, except that: 1) the new address 1302*b* is used, if present, and the original address 1302*a* is otherwise used; and 2) a column decoder 1202 of the memory core 902 selects the set of columns identified by the original column address 1406 for the write operation as described with regard to FIG. 12. In alternative embodiments, the column decoder 1202 and the original column address 1406 are omitted.

Figure 17:
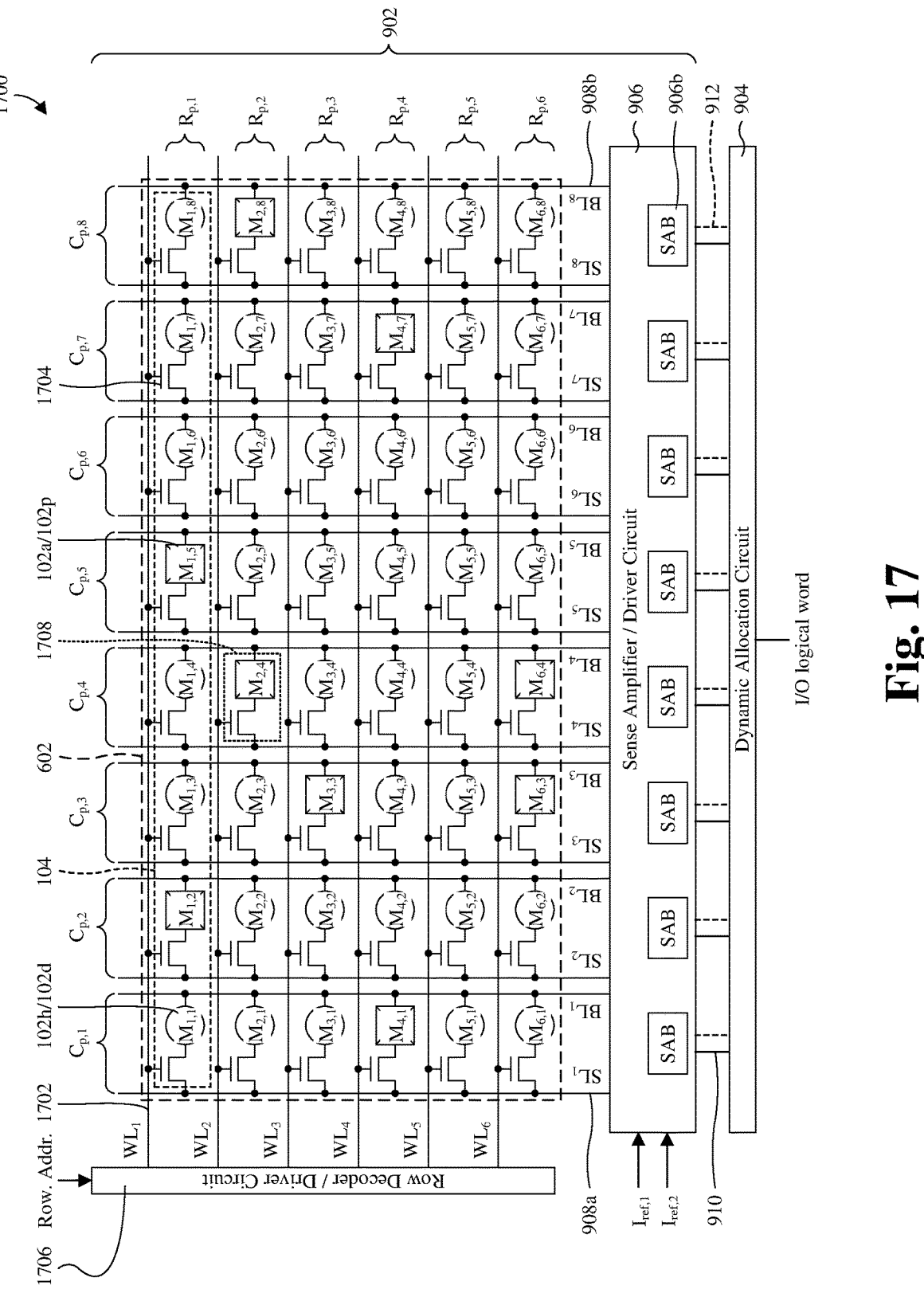
FIG. 17 illustrates a schematic diagram of some embodiments of the IC chip of FIG. 9 in which the IC chip comprises word lines, bit lines, and source lines.

With reference to FIG. 17, a schematic diagram 1700 of some embodiments of the IC chip of FIG. 9 is provided in which the IC chip has word lines 1702, source lines 908*a*, and bit lines 908*b*. The word lines 1702 are individual to the rows of the physical memory array 602 and extend respectively along the rows. For clarity, the word lines 1702 are individually labeled $WL_{<row\ number>}$, where the row number is an integer identifying a specific row in the physical memory array 602. The word lines 1702 electrically couple to gates of access transistors 1704 in the corresponding row and further electrically couple to a row decoder/driver circuit 1706.

The access transistors 1704 are individual to the memory cells 102 of the physical memory array 602 and electrically couple respectively to the corresponding memory cells 102 respectively at drain regions of the access transistors 1704. In some embodiments, each access transistor and its corresponding memory cell defines a one-transistor one-resistor (1T1R) cell 1708. The access transistors 1704 may, for example, be metal-oxide-semiconductor field-effect transistors (MOSFETs) and/or some other suitable type of transistors.

The row decoder/driver circuit 1706 is at periphery of the physical memory array 602 and is electrically coupled to the word lines 1702. The row decoder/driver circuit 1706 selects a word line corresponding to a specific row in response to a row address identifying the specific row. Particularly, the row decoder/driver circuit 1706 decodes the row address to identify the specific row and then biases the word line corresponding to the identified row so the access transistors in the identified row are in a conducting state. Further, while the word line corresponding to the identified row is biased so the access transistors in the identified row are in the conducting state, the row decoder/driver circuit 1706 biases the remaining word lines so the access transistors in the remaining rows are in a non-conducting state.

The source lines 908*a* and the bit lines 908*b* are individual to the columns of the physical memory array 602 and extend respectively along the corresponding columns. For clarity, the source lines 908*a* are individually labeled $SL_{<column\ number>}$, and the bit lines 908*b* are individually labeled $BL_{<column\ number>}$, where the column number is an integer identifying a specific column in the physical memory array 602. The source lines 908*a* electrically couple to the sources of the access transistors 1704 in the corresponding columns and further electrically couple to the sense amplifier/driver circuit 906. On the other hand, the bit lines 908*b* electrically couple to the memory cells 102 in the corresponding columns and further electrically couple to the sense amplifier/driver circuit 906. In some embodiments, bottom electrodes of the memory cells 102 (e.g., 702 in FIGS. 7A, 7B, 8A, and 8B) are electrically coupled to the drains of the corresponding access transistors 1704, whereas top electrodes of the memory cells 102 (e.g., 704 in FIGS. 7A, 7B, 8A, and 8B) are electrically coupled to the corresponding bit lines 908*b*. The sense amplifier/driver circuit 906 drives the source lines 908*a* and the bit lines 908*b* to read from and write to memory cells selected by the row decoder/driver circuit 1706.

During a write operation, the dynamic allocation circuit 904: 1) receives a logical word with fewer bits than a physical word; 2) dynamically allocates memory cells corresponding to the physical word to the logical word; 3) places each bit of the logical word in the physical bit location allocated to it; and 4) outputs write signals representing the physical word to the sense amplifier/driver circuit 906 over data lines 910. The write data signals are individual to the bits of the physical word and are hence individual to the columns of the physical memory array 602. Further, the write data signals encode the data states to set the memory cells in the corresponding columns to. The sense amplifier/driver circuit 906 receives the write data signals from the dynamic allocation circuit 904 and drives the source and bit lines 908*a*, 908*b* with the appropriate bias voltages to set the memory cells to the data states encoded by the corresponding write data signals.

During a read operation, the sense amplifier/driver circuit 906 biases the source and bit lines 908*a*, 908*b* with a read voltage to generate read currents individual to the columns of the physical memory array 602. Further, the sense amplifier blocks 906*b* of the sense amplifier/driver circuit 906 respectively compare the read currents to first and second reference currents $I_{ref,1}$, $I_{ref,2}$ to generate read data signals and read flag signals. The read data signals are individual to the columns of the physical memory array 602 and encode the data states read from the memory cells in the corresponding columns. Further, the read data signals represent a physical word read from the physical memory array 602. The read flag signals are also individual to the columns of the physical memory array 602 and encode whether the memory cells in the corresponding columns are in a data state or the permanent state. The dynamic allocation circuit 904: 1) receives the read data and flag signals respectively over the over the data lines 910 and the flag lines 912 from the sense amplifier/driver circuit 906; 2) dynamically allocates memory cells of the physical word to a logical word; 3) populates each bit location of the logical word with the physical bit allocated to it by the dynamic allocation; and 4) outputs the logical word.

While FIGS. 13, 14A, 15, 16A, and 17 illustrate the memory core 902 configured as in FIG. 9, the memory core 902 may alternatively be configured as in FIG. 12. In other words, FIGS. 13, 14A, 15, 16A, and 17 may alternatively have a column decoder 1202 as in FIG. 12. While FIGS. 14B and 16B illustrate the memory core 902 configured as in FIG. 12, the memory core 902 may alternatively be configured as in FIG. 9. In other words, FIGS. 14B and 16 may alternatively omit the column decoder 1202 and the original column address 1406.

With reference to FIGS. 18-24, 25A, 25B, 26, 27A, and 27B, a series of schematic diagrams 1800-2400, 2500A, 2500B, 2600, 2700A, 2700B of some embodiments of a method for memory repair using LUT-free dynamic memory allocation is provided. The method may, for example, be performed by or using the IC chip in any of FIGS. 9, 12, 13, 14A, 15, and 16A or by or using some other suitable IC chip.

Figure 18:
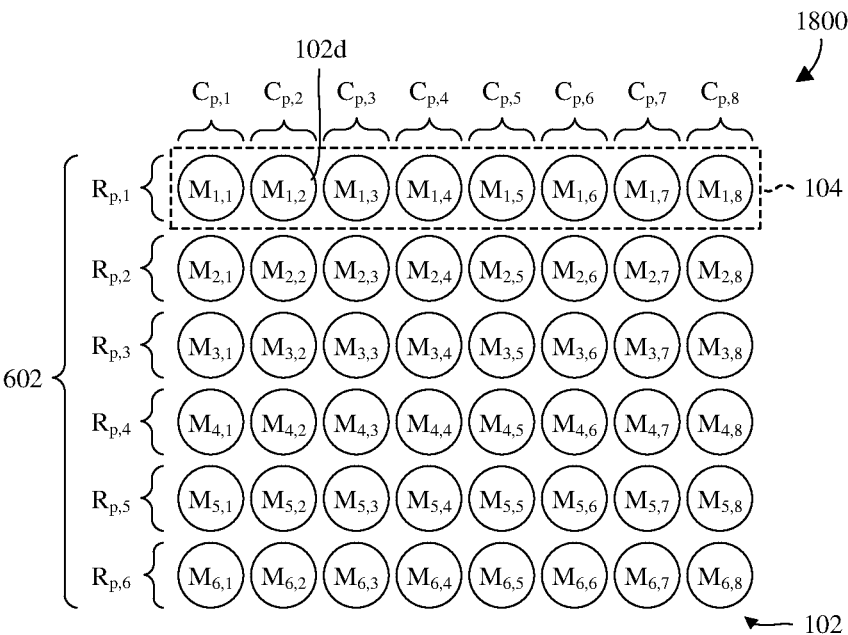
FIGS. 18-24, 25A, 25B, 26, 27A, and 27B illustrate a series of schematic diagrams of some embodiments of a method for memory repair using a LUT-free dynamic memory allocation process.

As illustrated by the schematic diagram 1800 of FIG. 18, a physical memory array 602 comprising a plurality of memory cells 102 in a plurality of rows and a plurality of columns is provided. As above, the memory cells 102 are individually labeled $M_{<row\ number>,<column\ number>}$, the rows are individually labeled $R_{p,<row\ number>}$, and the columns are individually labeled $C_{p,<column\ number>}$. Within the subscripts, "row number" and "column number" are integers respectively identifying a specific row and a specific column in the physical memory array 602.

The memory cells 102 are each in a first data state, a second data state, or a permanent state. The first data state may, for example, correspond to a logic "1", whereas the second data state may, for example, correspond to a logic "0", or vice versa. The permanent state may, for example, correspond to a state that is irreversible or is otherwise difficult to reverse. Further, the memory cells 102 are schematically illustrated as circles when in the first and second data states and are assumed to be healthy unless otherwise marked with a cross. Since all the memory cells 102 are circles without crosses in FIG. 18, all the memory cells are in data states (e.g., are data memory cells 102*d*) and are assumed to be healthy. In some embodiments, memory cells $M_{1,1}$ to $M_{1,8}$ in row $R_{p,1}$ respectively store 1, 0, 1, 1, 0, 1, 1, 0, where 1 and 0 correspond to the first and second data states. Other suitable values are, however, amenable.

The rows are configured to store corresponding physical words 104 each having a size of 8 bits and hence spanning 8 columns. In alternative embodiments, the physical words 104 have other suitable sizes. Further, in some embodiments, the rows are each configured to store multiple physical words, an example of which is shown in FIG. 5. As seen hereafter, the physical words 104 are larger than logical words to be written to or read from the physical memory array 602 to allow for redundancy. For example, the logical words may have a size of 6 bits to allow for 2 bits of redundancy. Other suitable sizes are, however, amenable for the logical words. In some embodiments, the memory cells at column $C_{p,7}$ and column $C_{p,8}$ correspond to redundancy.

In some embodiments, the memory cells 102 are MRAM cells, RRAM cells, FeRAM cells, or some other suitable type of memory cells. In at least some of such embodiments, the memory cells 102 may be devoid of selectors and/or may be set to the permanent state by dielectric breakdown of insulators separating top and bottom electrodes. In alternative embodiments, the memory cells 102 are 1S1R memory cells comprising individual resistive memory elements and individual selectors. In at least some of such embodiments, the memory cells 102 may be set to the permanent state by dielectric breakdown of insulators in the resistive memory elements and/or in the selectors. The resistive memory element may, for example, be an MRAM cell, a FeRAM cell, an RRAM cell, a PCM cell, or some other suitable type of resistive memory element.

Figure 19:
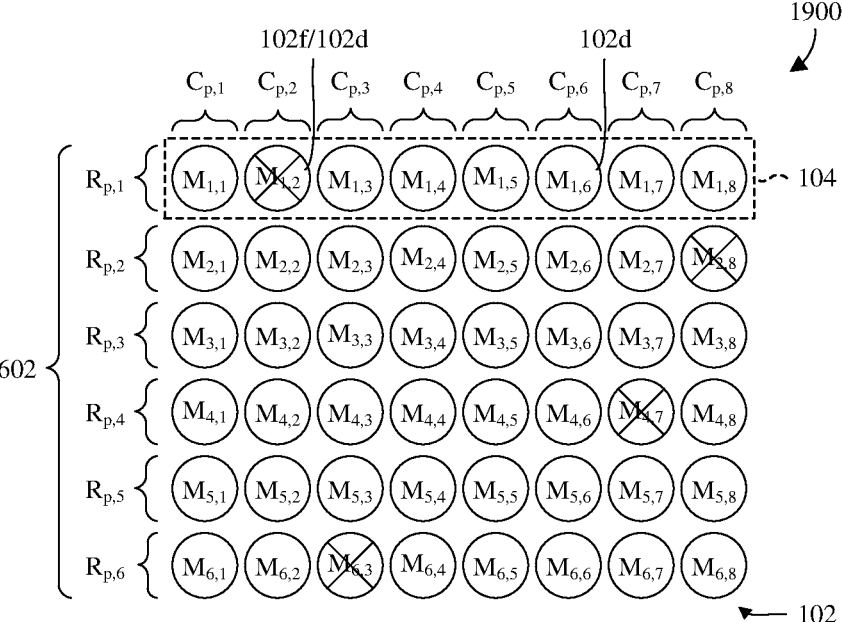

As illustrated by the schematic diagram 1900 of FIG. 19, failed memory cells 102*f* in the physical memory array 602 are identified. Failed memory cells 102*f* are schematically identified with a cross and are memory cells that do not operate at all or that do not operate as intended (e.g., fall outside of design specifications). For example, a design specification may indicate that a write to the first data state is to occur within a specific voltage range. Any memory cells that fail to enter the first data state when biased within the specific voltage range may fall outside the design specification and may hence be considered failed memory cells. Notwithstanding that a write voltage was used in the above example, other suitable parameters are amenable. The failed memory cells 102*f* may, for example, be determined by CP testing or by some other suitable testing process during formation of an IC chip comprising the physical memory array 602.

Figure 20:
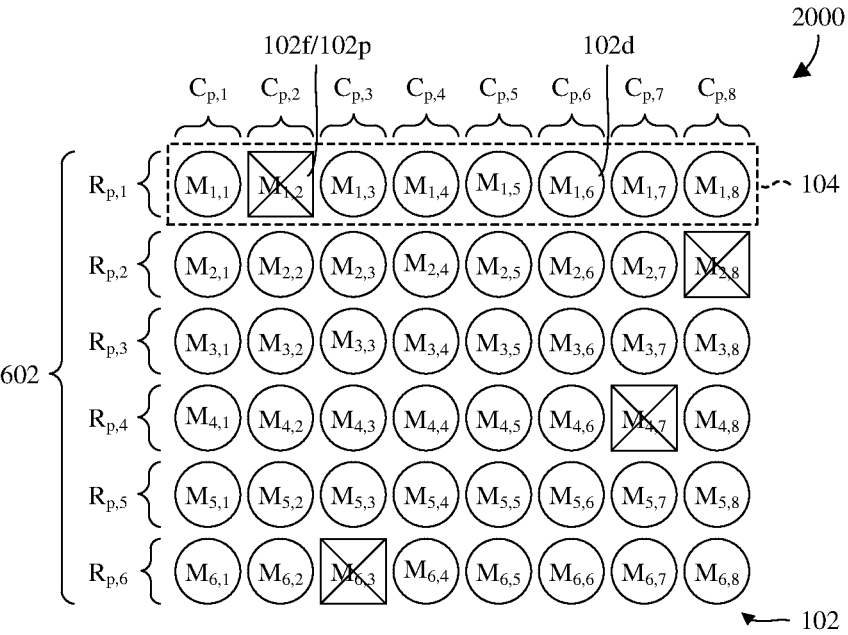

As illustrated by the schematic diagram 2000 of FIG. 20, a determination is made as to whether there is sufficient redundancy to accommodate the failed memory cells 102*f* that have been identified. In other words, a determination is made as to whether the failed memory cells 102*f* that have been identified fall within the repair budget. As described above, there are two redundant memory cells per physical word 104. Therefore, because there is at most one failed memory cell per row, there is sufficient redundancy.

Because it was determined that there is sufficient redundancy, the failed memory cells 102*f* are set to the permanent state. For clarity, memory cells in the permanent state (e.g., permanent memory cells 102*p*) are schematically illustrated as squares, whereas memory cells in the first and second data states (e.g., data memory cells 102*d*) are schematically illustrated as circles. In some embodiments, the failed memory cells 102*f* are set to the permanent state by biasing the failed memory cells 102*f* with a high voltage to invoke permanent or near permanent dielectric breakdown of insulators separating top and bottom electrodes of the failed memory cells 102*f*. Other suitable processes are, however, amenable in alternative embodiments. If it had been determined that there was insufficient redundancy, the physical memory array 602 would be unworkable and hence scrapped.

Figure 21:
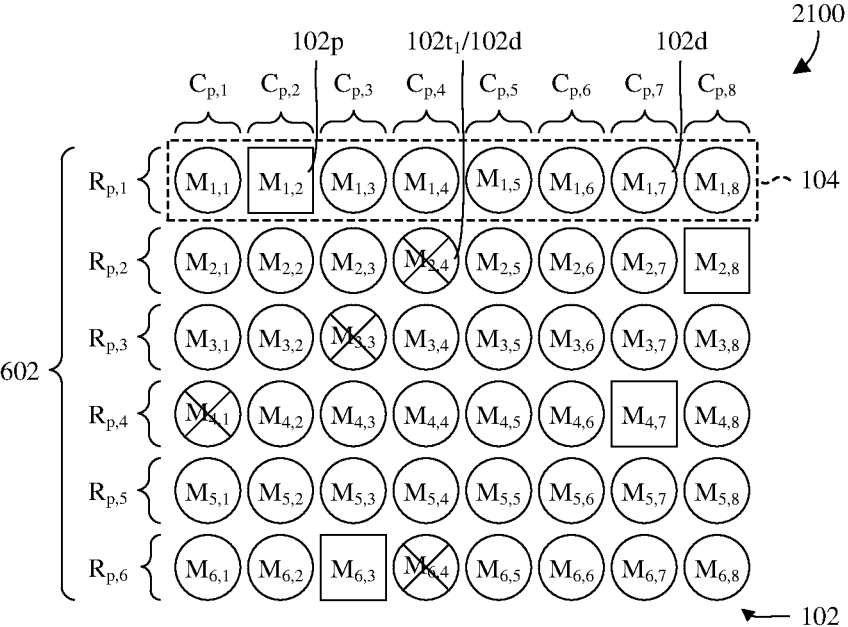
Figure 29:
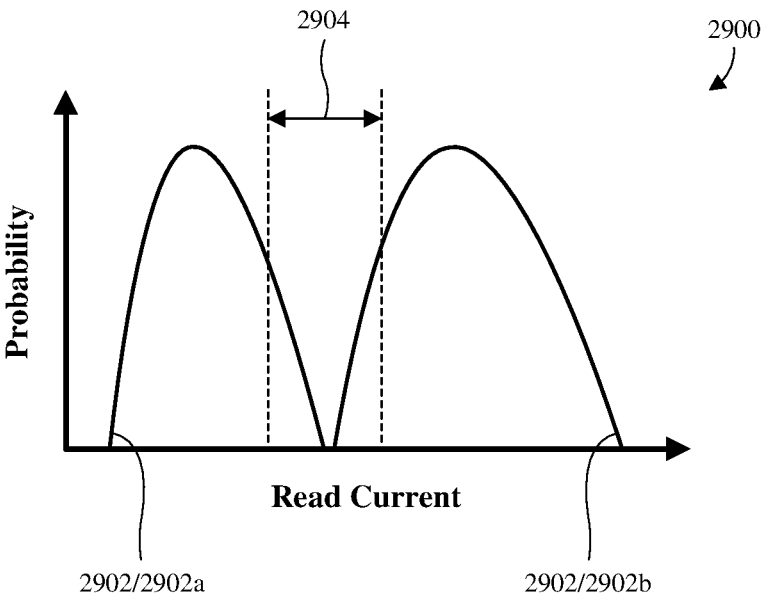
FIG. 29 illustrates a graph of some embodiments of read current probability distributions for selecting tail memory cells.

As illustrated by the schematic diagram 2100 of FIG. 21, first tail memory cells 102$t_1$ worse than a threshold are identified. For clarity, the first tail memory cells 102$t_1$ are schematically identified with crosses. The first tail memory cells 102$t_1$ are memory cells that fall within design specifications but are amongst the poorest performing memory cells. FIGS. 28 and 29 discussed hereafter provided non-limiting examples of tail selection. The first tail memory cells 102$t_1$ may, for example, be determined by CP testing or by some other suitable testing process during formation of an IC chip comprising the physical memory array 602.

Figure 22:
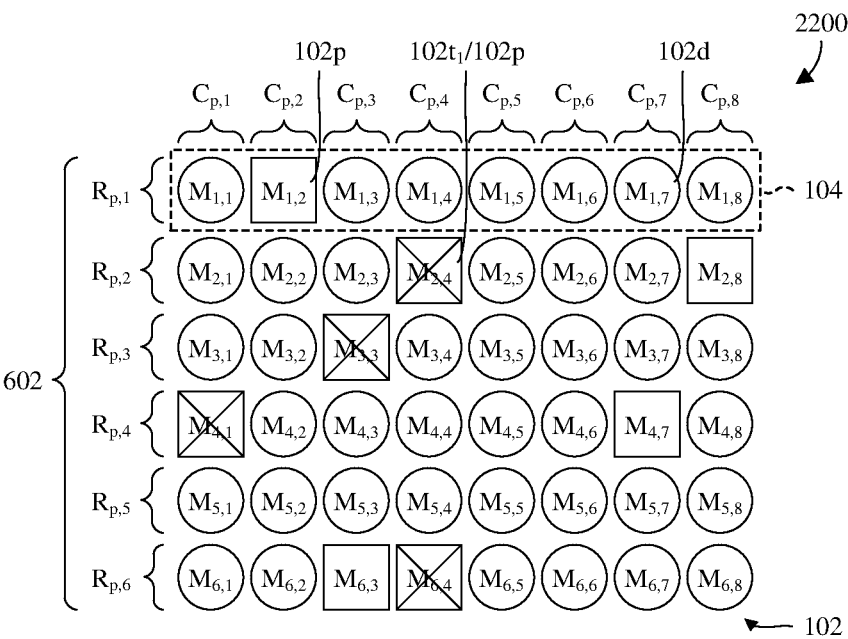

As illustrated by the schematic diagram 2200 of FIG. 22, a determination is made as to whether there is sufficient redundancy to accommodate the first tail memory cells 102$t_1$ that have been identified. In other words, a determination is made as to whether the first tail memory cells 102$t_1$ that have been identified fall within the repair budget. As described above, there are two redundant memory cells per physical word 104. Since each row has enough redundancy to accommodate the failed memory cells 102$f$ identified at FIG. 19 (now represented as permanent memory cells 102$p$) and also the first tail memory cells 102$t_1$ identified at FIG. 21, there is sufficient redundancy.

Because it was determined that there is sufficient redundancy, the first tail memory cells 102$t_1$ are set to the permanent state. As above, memory cells in the permanent state (e.g., permanent memory cells 102$p$) are schematically illustrated as squares, whereas memory cells in the first and second data states (e.g., data memory cells 102$d$) are schematically illustrated as circles. In some embodiments, the first tail memory cells 102$t_1$ are set to the permanent state by biasing the first tail memory cells 102$t_1$ with a high voltage to invoke permanent or near permanent dielectric breakdown of insulators separating top and bottom electrodes of the first tail memory cells 102$t_1$. Other suitable processes are, however, amenable. If it had been determined that there was insufficient redundancy, the physical memory array 602 would proceed to operation without setting any additional memory cells to the permanent state.

Figure 23:
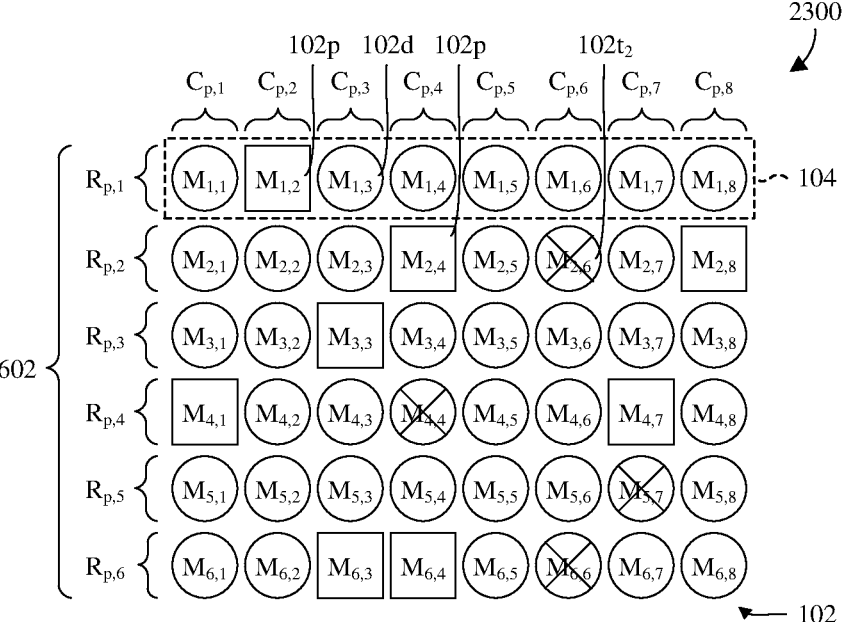

As illustrated by the schematic diagram 2300 of FIG. 23, the threshold for tail selection is adjusted to capture more of the poorest performing memory cells. Further, the acts at FIGS. 21 and 22 are repeated. As such, second tail memory cells 102$t2$ that perform better than the first tail memory cells 102$t_1$ of FIG. 21, but are still amongst the poorest performing memory cells, are identified. For clarity, the second tail memory cells 102$t2$ are schematically identified with crosses. Additionally, after identifying the second tail memory cells 102$t2$, it is determined that there is insufficient redundancy to accommodate the second tail memory cells 102$t2$. For example, row $R_{p,2}$ would need three redundant memory cells to accommodate the memory cells already in the permanent state and a second tail memory cell. Because there is insufficient redundancy, the physical memory array 602 proceeds to operation without setting any additional memory cells to the permanent state.

Figure 24:
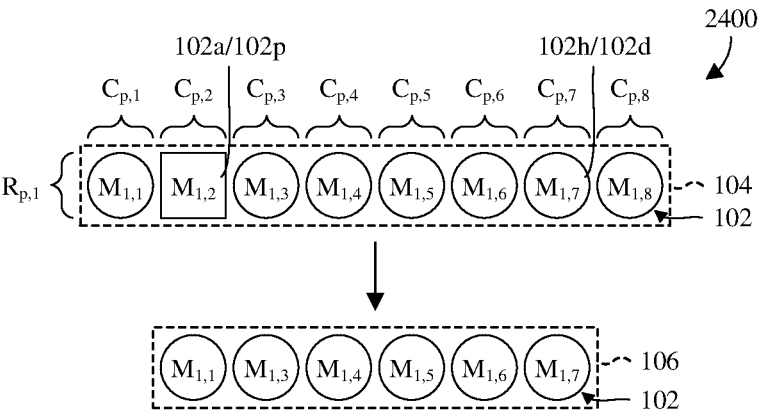

As illustrated by the schematic diagram 2400 of FIG. 24, a row of the physical memory array 602 (see, e.g., FIG. 23) is selected for a read or write operation. As illustrated, row $R_{p,1}$ is selected, but any other row in the physical memory array 602 may be selected. The row may, for example, be selected in accordance with a row address. Additionally, to the extent that the row is configured to store multiple physical words 104, columns corresponding to a single physical word are selected. The columns may, for example, be selected in accordance with a column address.

Also illustrated by the schematic diagram 2400 of FIG. 24, healthy memory cells 102$h$ are dynamically allocated to a logical word 106. Healthy and abnormal memory cells 102$h$, 102$a$ are identified using the permanent state to distinguish between the healthy memory cells 102$h$ and the abnormal memory cells 102$a$. The healthy memory cells 102$h$ are in the first and second data states, whereas the abnormal memory cells 102$a$ are in the permanent state. Hence, the healthy memory cells 102$h$ are generally the same as the data memory cells 102$d$, and the abnormal memory cells 102$a$ are generally the same as the permanent memory cells 102$p$. The abnormal memory cells 102$a$ include the failed memory cells 102$f$ identified at FIG. 19, as well as the first tail memory cells 102$t_1$ identified at FIG. 21, since these memory cells have been set to the permanent state.

With the identification complete, the healthy memory cells 102$h$, but not the abnormal memory cells 102$a$, are dynamically allocated to the logical word 106 from left to right until the number of allocated memory cells is the same as the number of bits in the logical word 106. Because memory cell $M_{1,2}$ is in the permanent state (as schematically illustrated by the square shape), this memory cell is skipped during dynamic allocation.

Figure 25A:
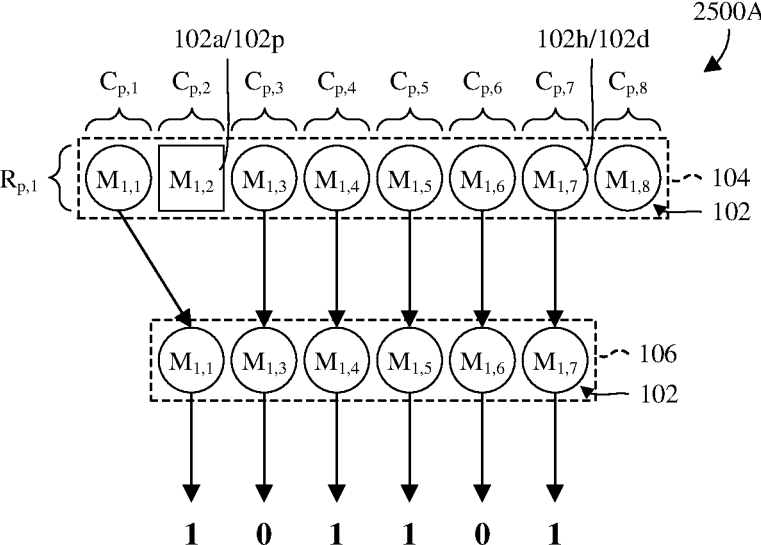

As illustrated by the schematic diagram 2500A of FIG. 25A, the logical word 106 is read from the allocated memory cells. Each bit location of the logical word 106 is populated with the physical bit allocated to it by the dynamic allocation. For example, the second bit location of the logical word 106 may be populated with the third bit of the physical word 104, which corresponds to memory cell $M_{1,3}$. In some embodiments, as illustrated, the logical word 106 read from the memory cells 102 is "101101", where 1 and 0 correspond to the first and second data states. Other suitable values are, however, amenable.

Figure 25B:
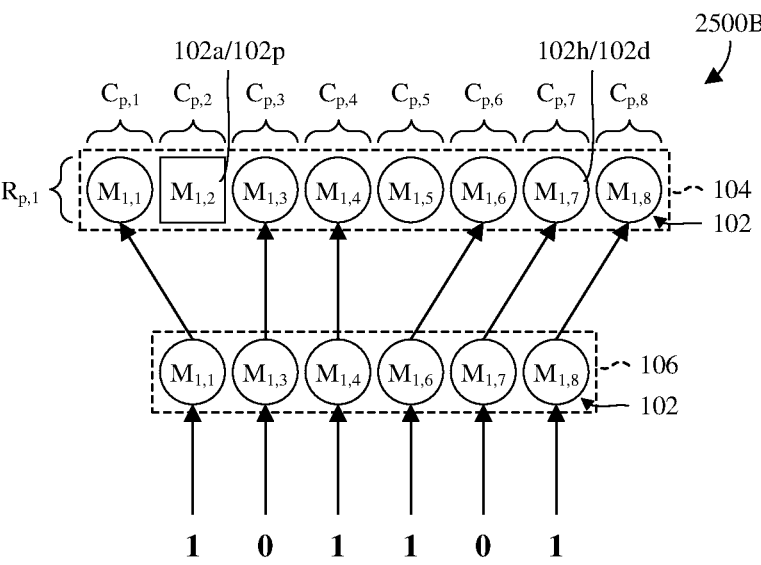

As illustrated by the schematic diagram 2500B of FIG. 25B, the logical word 106 is alternatively written to the allocated memory cells. In other words, FIG. 25B is an alternative to FIG. 25A and proceeds from FIG. 24 while skipping FIG. 25A. Each bit of the logical word 106 is placed into the physical bit location allocated to it by the dynamic allocation. For example, the second bit of the logical word 106 is placed in the third bit location of the physical word 104, which corresponds to memory cell $M_{1,3}$. In some embodiments, as illustrated, the logical word 106 written to the memory cells 102 is "101101", where 1 and 0 correspond to the first and second data states. Other suitable values are, however, amenable.

Figure 26:
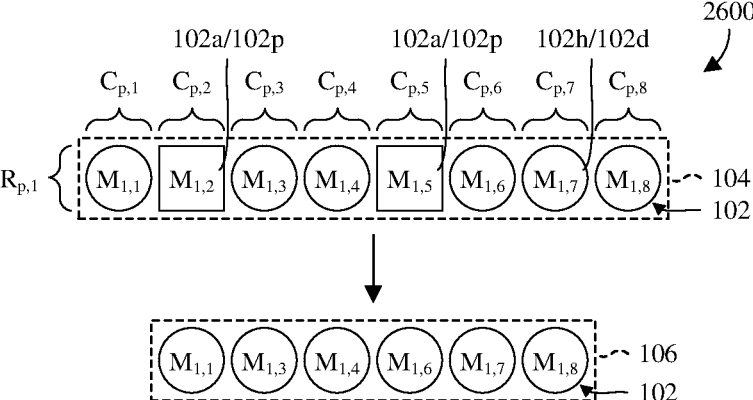
Figure 27A:
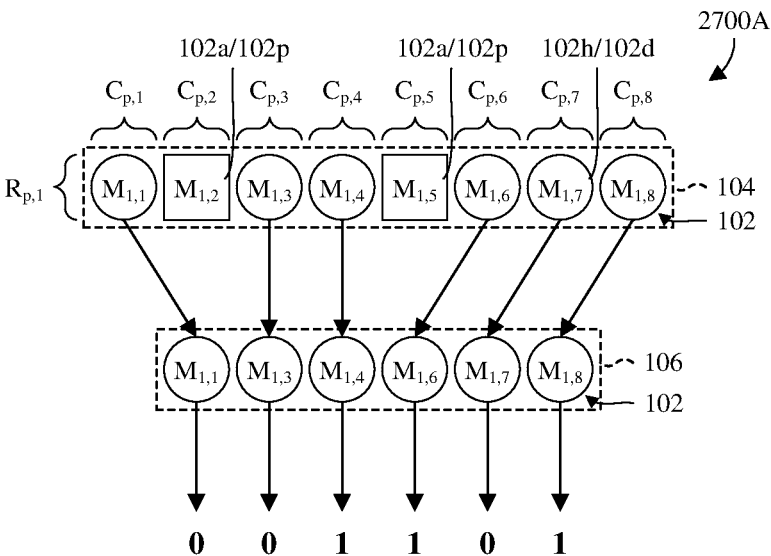
Figure 27B:
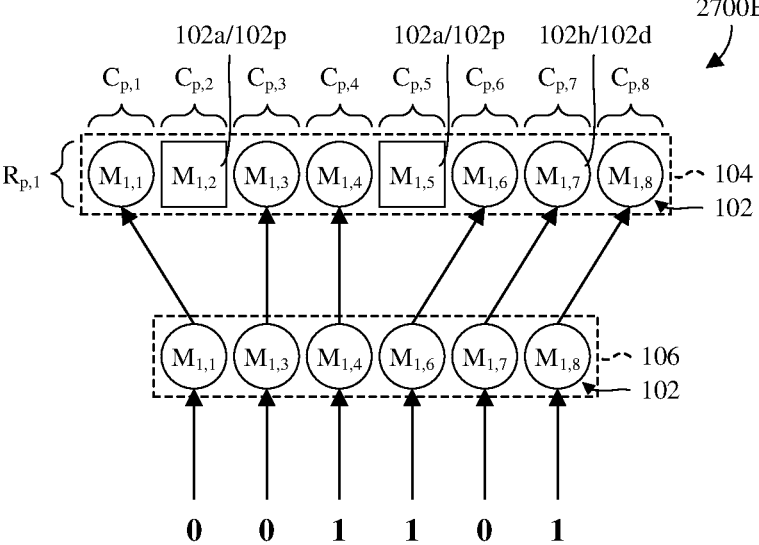

As illustrated by the schematic diagrams 2600, 2700A, 2700B of FIGS. 26, 27A, and 27B, the acts of FIGS. 24, 25A, and 25B are respectively repeated. However, between completing the acts of FIGS. 24, 25A, and 25B and beginning the acts of FIGS. 26, 27A, and 27B, memory cell $M_{1,5}$ failed and was set to the permanent state. The failure may, for example, have been detected by an ECC circuit or by some other suitable circuit. Because memory cell $M_{1,5}$ is set to the permanent state, the dynamic allocation to the logical word 106 changes to skip memory cell $M_{1,5}$ and the logical word 106 is read from or written to a different set of memory cells. Similar to FIGS. 25A and 25B, FIGS. 27A and 27B are alternative of each other, such that the method proceeds from FIG. 25A or 25B to FIG. 26 and from FIG. 26 to FIG. 27A or 27B.

As seen in FIGS. 18-24, 25A, 25B, 26, 27A, and 27B, by flagging the abnormal memory cells 102$a$ using the permanent state, and by then using the LUT-free dynamic memory allocation process to filter out the abnormal memory cells 102*a* that are flagged during read and write operations, bitwise memory repair may be achieved without a LUT. Accordingly, latency and power consumption may be low and memory density may be high. By performing memory repair bitwise, repair efficiency may be high. The high repair efficiency may allow the repair budget (e.g., the number of bits that can be repaired) to be increased. The increased repair budget may allow tail memory cells to be replaced for improved power efficiency and/or speed. Further, the increased repair budget may allow process and/or design constraints to be relaxed.

While FIGS. 18-24, 25A, 25B, 26, 27A, and 27B are described with reference to a method, it will be appreciated that the structures shown in FIGS. 18-24, 25A, 25B, 26, 27A, and 27B are not limited to the method but rather may stand alone separate of the method. While FIGS. 18-24, 25A, 25B, 26, 27A, and 27B are described as a series of acts, it will be appreciated that the order of the acts may be altered in other embodiments. While FIGS. 18-24, 25A, 25B, 26, 27A, and 27B illustrate and describe as a specific set of acts, some acts that are illustrated and/or described may be omitted in other embodiments. Further, acts that are not illustrated and/or described may be included in other embodiments. For example, as memory cells fail over the life of the physical memory array 602 (see, e.g., FIG. 23), these memory cells may be set to the permanent state for replacement according to the LUT-free dynamic memory allocation process of the present disclosure. Such memory cells may, for example, be identified during the life of the physical memory array 602 using an ECC circuit or by some other suitable circuit for detecting memory errors.

With reference to FIG. 28, a flow chart 2800 of some embodiments of the method of FIGS. 18-24, 25A, 25B, 26, 27A, and 27B is provided.

At act 2802, an array of memory cells having a plurality of rows and a plurality of columns is provided, where each memory cell of the array is in a first data state, a second data state, or a permanent state, and where memory cells at a first row of the array are configured to store a physical word. See, for example, FIG. 18.

At act 2804, failed memory cells are identified in the array. See, for example, FIG. 19. As discussed above, failed memory cells are memory cells that do not operate at all or that do not operate as intended (e.g., fall outside of design specifications).

At act 2806, a determination is made as to whether the failed memory cells fall within the repair budget of the memory array. See, for example, FIG. 20. If the failed memory cells fall outside of the repair budget (e.g., there are too many failed memory cells for repair), the method fails and the array is scrapped. However, if the failed memory cells fall within the repair budget, the method proceeds to act 2808.

At act 2808, the failed memory cells are set to the permanent state to flag the failed memory cells. See, for example, FIG. 20.

At act 2810, tail memory cells worse than a threshold are identified in the memory array. See, for example, FIG. 21. As discussed above, tail memory cells are memory cells that fall within design specifications but are amongst the poorest performing memory cells.

At act 2812, a determination is made as to whether the tail memory cells fall within the repair budget of the memory array. See, for example, FIG. 22. If the tail memory cells fall outside of the repair budget (e.g., there are too many tail memory cells for repair), the method proceeds to act 2818. Otherwise, the method proceeds to act 2814.

At act 2814, the tail memory cells are set to the permanent state to flag the tail memory cells. See, for example, FIG. 22.

At act 2816, the threshold is adjusted to capture more tail memory cells and the method proceeds back to act 2810. See, for example, FIG. 23.

At act 2818, a read or write operation is performed on the memory cells corresponding to the physical word. See, for example, FIGS. 24, 25A, 25B, 26, and 27A, 27B. At act 2818*a*, healthy memory cells corresponding to the physical word and abnormal memory cells corresponding to the physical word are identified using the permanent state to discriminate between the healthy and abnormal memory cells. See, for example, FIG. 24. At act 2818*b*, the healthy memory cells are dynamically allocated to a logical word while excluding the abnormal memory cells. See, for example, FIGS. 24 and 26. At act 2818*c*, the logical word is read from, or written to, the healthy memory cells dynamically allocated to the logical word. See, for example, FIGS. 25A, 25B, 27A, and 27B respectively for reading and writing.

While the flow chart 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIG. 29, a graph 2900 of some embodiments of read current probability distributions 2902 for identifying tail memory cells is provided. The horizontal axis corresponds to read current, and the vertical axis corresponds to probability. The read current probability distributions 2902 include a first read current probability distribution 2902*a* for a memory cell in the first data state and further include a second read current probability distribution 2902*b* for a memory cell in the second data state.

When reading memory cells, the larger the difference between the first and second read current probability distributions 2902*a*, 2902*b*, the easier it is to distinguish between the first and second data states and hence the more reliable the memory cells are. Therefore, the higher the read current for a memory cells in the first data state, the worse the memory cell performs. Further, the lower the read current for a memory cell in the second data state, the worse the memory cell perform. With this in mind, tail selection may involve selecting memory cells within a tail window 2904 that is centered between the first and second read current probability distributions 2902*a*, 2902*b* and that overlaps with the poorest performing memory cells in the first and second data states. In other words, tail selection may involve selecting memory cells that are above a lower threshold of the tail window 2904 when in the first data state and that are below an upper threshold of the tail window 2904 when in the second data state. Further, to the extent that multiple iterations of tail selection are performed, the tail window 2904 may be incrementally enlarged to capture more tail bits.

As discussed above, the larger repair budget from using LUT-free dynamic memory allocation allows tail memory cells to be replaced with better performing memory cells. This, in turn, allows an increase in the separation between the first and second read current probability distributions 2902*a*, 2902*b*. By increasing the separation between the first and second read current probability distributions 2902*a*, 2902*b*, resiliency of a memory array may be increased. Further, process and/or design constraints may be relaxed.

Figure 30:
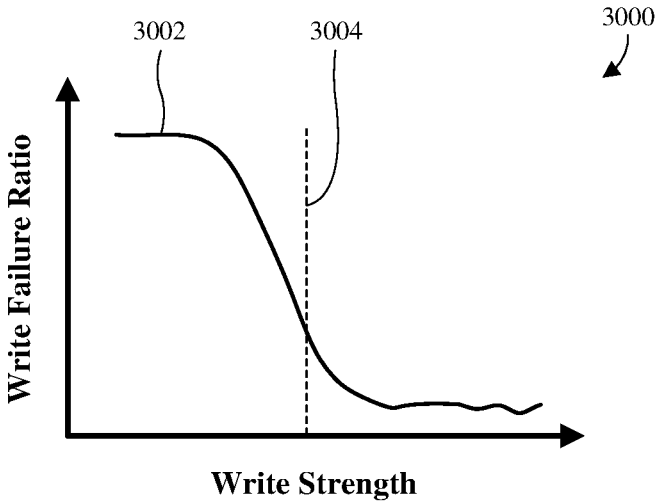
FIG. 30 illustrates a graph of some embodiments of write failure ratio over different write strengths for selecting tail memory cells.

With reference to FIG. 30, a graph 3000 of some embodiments of a curve 3002 describing a write failure ratio over different write strengths is provided. The vertical axis corresponds to write failure ratio, which is the ratio of failed memory cells in a memory array to total memory cells in the memory array. The horizontal axis corresponds to write strength, which may, for example, be write voltage, write current, write pulse width, or some other suitable parameters affecting the write strength.

When writing to memory cells, the lower the write strength, the better. Lower write strengths lead to less power consumption, longer life, and so on. Therefore, the higher the write strength for a memory cell, the worse the memory cell performs. With this in mind, tail selection may involve selecting memory cells dependent on high write strengths in excess of a threshold write strength 3004. Further, to the extent that multiple iterations of tail selection are performed, the threshold write strength 3004 may be incrementally decreased to capture more tail bits.

As discussed above, the larger repair budget from using LUT-free dynamic memory allocation allows tail memory cells to be replaced with better performing memory cells. This, in turn, allows reduced write strength. By reducing write strength, power consumption may be reduced, reliability may be increased, and process and/or design constraints may be relaxed.

With reference to FIGS. 31-36, 37A, and 37B, a series of schematic diagrams 3100-3600, 3700A, 3700B of some embodiments of a method for memory repair using LUT-free dynamic memory allocation and a LUT-based memory allocation is provided. The method may, for example, be performed by or using the IC chip in any of FIGS. 9, 12, 14B, and 16B or by or using some other suitable IC chip.

Figure 31:
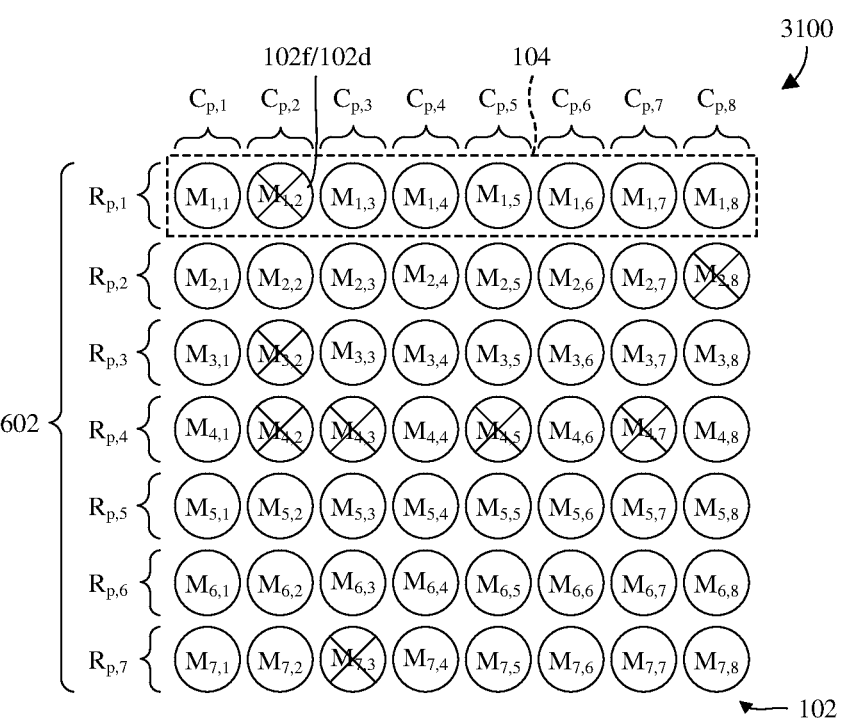
FIGS. 31-36, 37A, and 37B illustrate a series of schematic diagrams of some embodiments of a method for memory repair using a LUT-free dynamic memory allocation process and a LUT.

As illustrated by the schematic diagram 3100 of FIG. 31, the acts described with regard to FIGS. 18 and 19 are performed. A physical memory array 602 is provided as described with regard to FIG. 18, except that the physical memory array 602 includes an additional row (e.g., row $R_{p,7}$) for LUT-based redundancy. In alternative embodiments, the physical memory array 602 includes additional rows for LUT-based redundancy. Failed memory cells 102*f* in the physical memory array 602 are then identified as described with regard to FIG. 19. Failed memory cells 102*f* are schematically identified with crosses.

Figure 32:
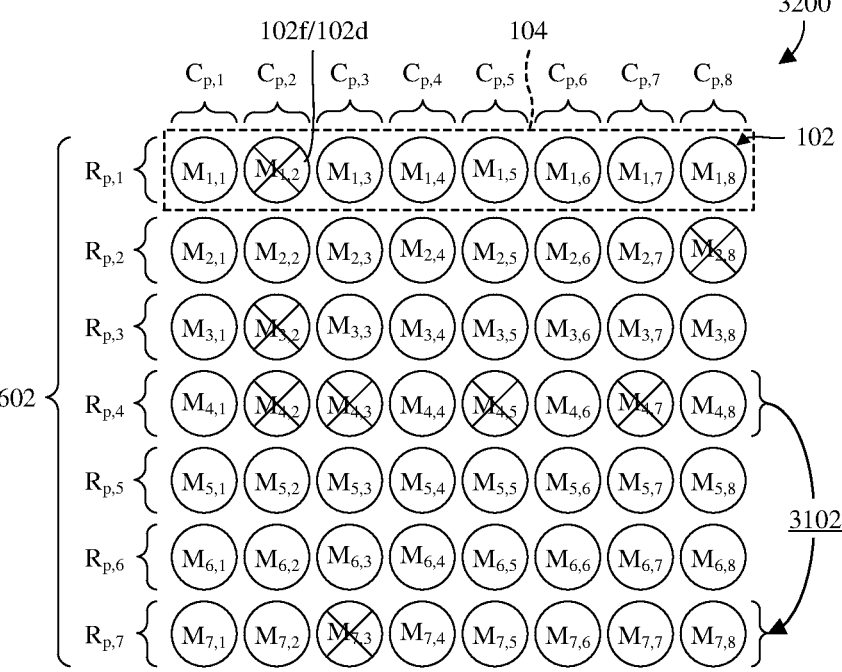

As illustrated by the schematic diagram 3200 of FIG. 32, a worst row (e.g., row $R_{p,4}$) is identified. The worst row is the row with the most failed memory cells. Further, the worst row is mapped to the redundant row for replacement as schematically illustrated by a first arrow 3102. The row mapping may, for example, be achieved adding the row address of the worst row and the row address of the redundant row to a row repair LUT (see, e.g., 1408 at FIGS. 14B and 16B). In alternative embodiments, the physical memory array 602 includes one or more additional redundant rows. In at least some of these alternative embodiments, one or more additional worst rows may be mapped to the additional redundant row(s) for replacement. In some embodiments, the memory cells 102 in the redundant row (e.g., $R_{p,7}$) respectively store 1, 0, 1, 1, 0, 1, 0, 1, where 1 and 0 correspond to the first and second data states. Other suitable values are, however, amenable.

Figure 33:
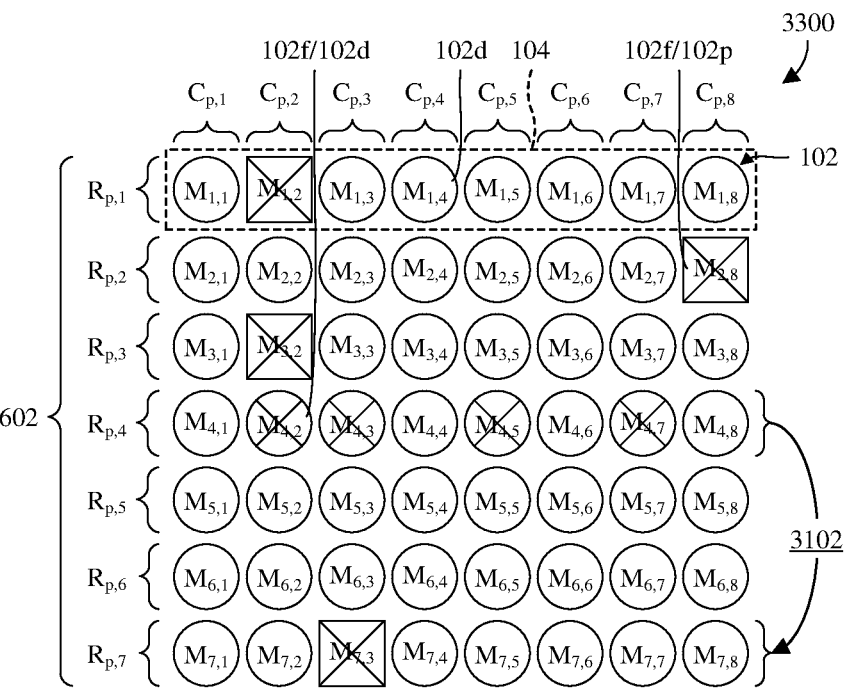

As illustrated by the schematic diagram 3300 of FIG. 33, the acts described with regard to FIG. 20 are performed. A determination is made as to whether there is sufficient redundancy to accommodate a remainder of the failed memory cells 102*f* that have been identified. The remainder of failed memory cells correspond to failed memory cells that are not in the worst row (e.g., row $R_{p,4}$). Additionally, it is determined that there is sufficient redundancy, so the remainder of the failed memory cells 102*f* are set to the permanent state. For clarity, memory cells in the permanent state (e.g., permanent memory cells 102*p*) are schematically illustrated as squares, whereas memory cells in the first and second data states (e.g., data memory cells 102*d*) are schematically illustrated as circles. If it had been determined that there was insufficient redundancy, the physical memory array 602 would be unworkable and hence scrapped.

Figure 34:
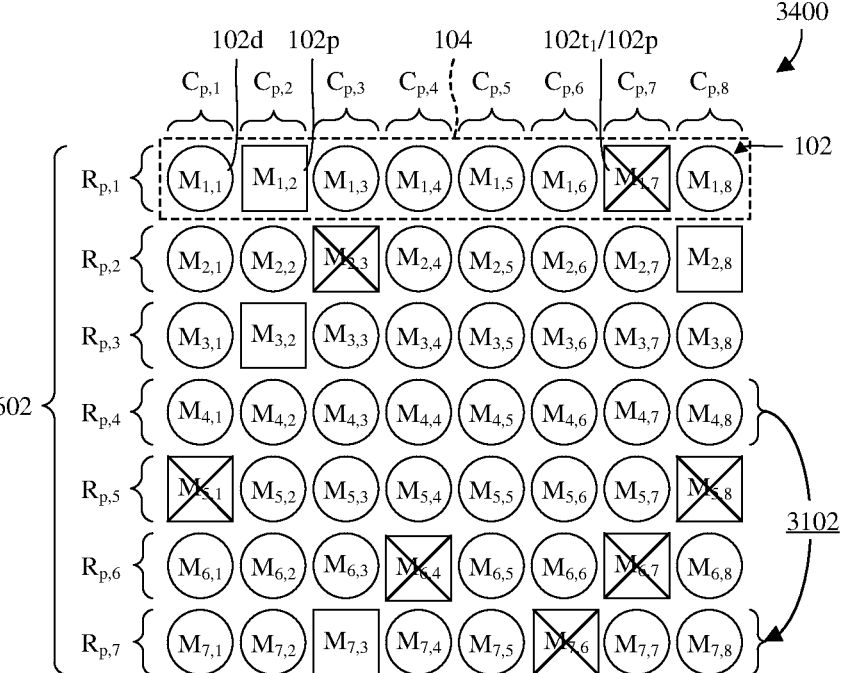

As illustrated by the schematic diagram 3400 of FIG. 34, the acts described with regard to FIGS. 21 and 22 are performed. First tail memory cells 102*t₁* worse than a threshold are identified as described with regard to FIG. 21. For clarity, the first tail memory cells 102*t₁* are schematically identified with crosses. A determination is made as to whether there is sufficient redundancy to accommodate the first tail memory cells 102*t₁* that have been identified as described with regard to FIG. 22. Further, it is determined that there is sufficient redundancy, so the first tail memory cells 102*t₁* are set to the permanent state as described with regard to FIG. 22. If it had been determined that there was insufficient redundancy, the physical memory array 602 would proceed to operation without setting any additional memory cells to the permanent state.

Figure 35:
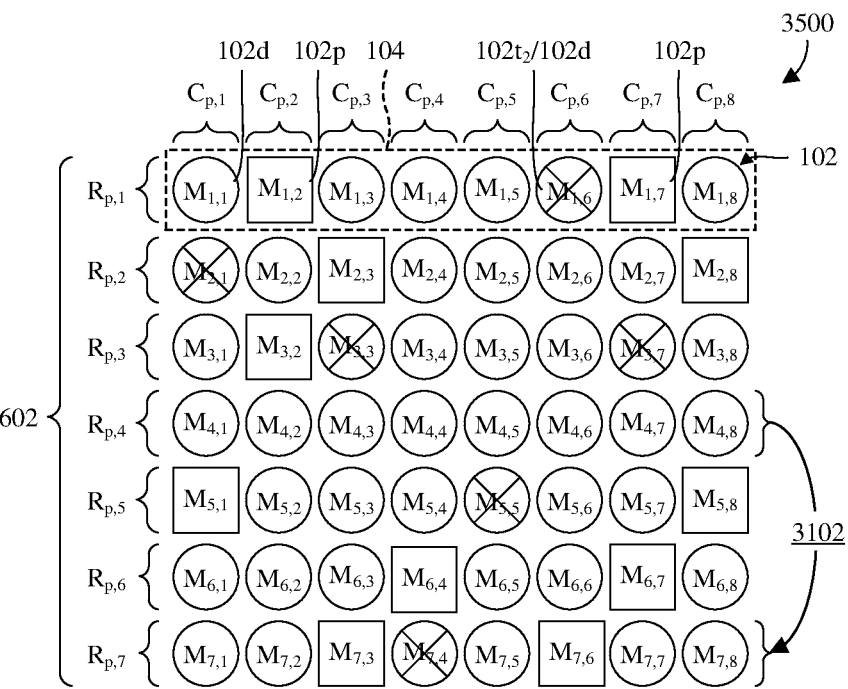

As illustrated by the schematic diagram 3500 of FIG. 35, the threshold for tail selection is adjusted to capture more of the poorest performing memory cells. Further, the acts at FIGS. 21 and 22 are repeated. As such, second tail memory cells 102*t₂* that perform better than the first tail memory cells 102*t₁* of FIG. 34, but are still amongst the poorest performing memory cells, are identified. Additionally, it is determined that there is insufficient redundancy to accommodate the second tail memory cells 102*t₂*. As such, the physical memory array 602 proceeds to operation without setting any additional memory cells to the permanent state.

Figure 36:
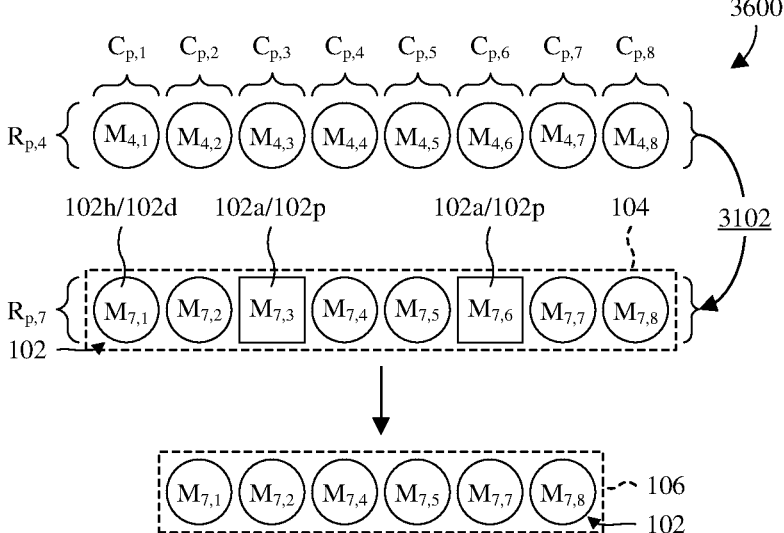

As illustrated by the schematic diagram 3600 of FIG. 36, the worst row (e.g., row $R_{p,4}$) of the physical memory array 602 (see, e.g., FIG. 35) is selected for a read or write operation. This is performed as described with regard to FIG. 24, except that the redundant row (e.g., row $R_{p,7}$) is used in place of the worst row because the worst row is mapped to the redundant row as schematically shown by the first arrow 3102. If the selected row was not mapped to the redundant row, the selected row would be used. Further, to the extent that the row is configured to store multiple physical words 104, columns corresponding to a single physical word are selected.

Also illustrated by the schematic diagram 3600 of FIG. 36, healthy memory cells 102*h* are dynamically allocated to a logical word 106 while excluding abnormal memory cells 102*a* as described with regard to FIG. 24.

Figure 37A:
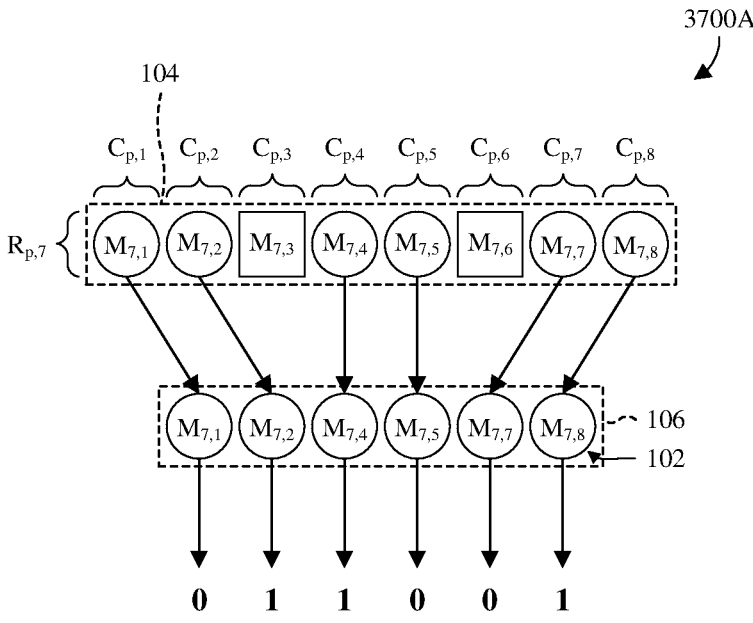
Figure 37B:
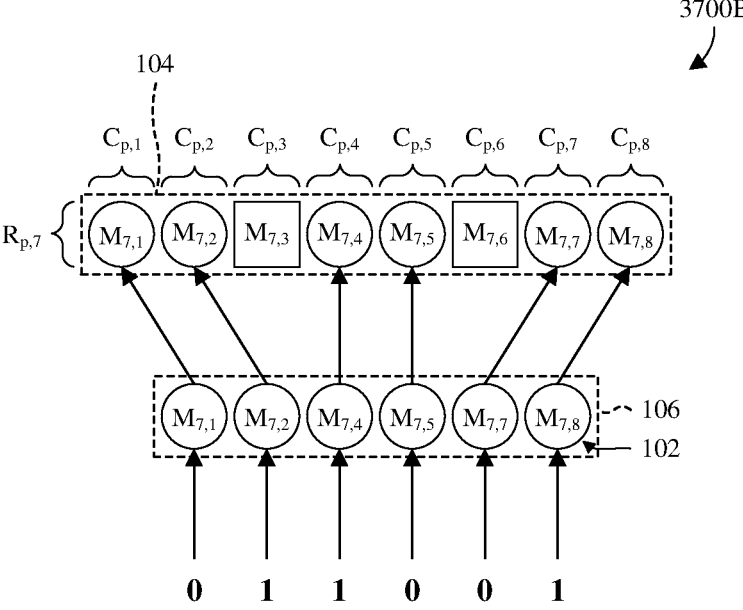

As illustrated by the schematic diagrams 3700A, 3700B of FIGS. 37A and 37B, the acts described with regard to FIGS. 25A and 25B are respectively performed. At FIG. 37A, the logical word 106 is read from the allocated memory cells as described with regard to FIG. 25A. At FIG. 37B, the logical word 106 is written to the allocated memory cells as described with regard to FIG. 25B. As with FIGS. 25A and 25B, FIGS. 37A and 37B are alternatives of each other, such that the method proceeds from FIG. 36 to either FIG. 37A or 37B.

While FIGS. 31-36, 37A, and 37B are described with reference to a method, it will be appreciated that the structures shown in FIGS. 31-36, 37A, and 37B are not limited to the method but rather may stand alone separate of the method. While FIGS. 31-36, 37A, and 37B are described as a series of acts, it will be appreciated that the order of the acts may be altered in other embodiments. While FIGS. 31-36, 37A, and 37B illustrate and describe as a specific set of acts, some acts that are illustrated and/or described may be omitted in other embodiments. Further, acts that are not illustrated and/or described may be included in other embodiments. For example, as memory cells fail over the life of the physical memory array 602 (see, e.g., FIG. 35), these memory cells may be set to the permanent state for replacement according to the LUT-free dynamic memory allocation process of the present disclosure. Such memory cells may, for example, be identified during the life of the physical memory array 602 using an ECC circuit or by some other suitable circuit for detecting memory errors.

With reference to FIG. 38, a flow chart 3800 of some embodiments of the method of FIGS. 31-36, 37A, and 37B is provided. The flow chart 3800 is as the flow chart 2800 of FIG. 28 is illustrated and described, except for act 3802 between act 2806 and act 2808. At act 3802, one or more of the worst rows are respectively mapped to one or more redundant rows. The redundant row(s) are then used in place of the worst row(s).

While the flow chart 3800 of FIG. 38 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a method including: providing an array of memory cells having a plurality of rows and a plurality of columns, wherein the plurality of rows includes a first row; identifying individual states of memory cells of the array in the first row, wherein the states are respectively a first data state, a second data state, and a permanent state; allocating memory cells identified respectively with the first and second data states into a logical word while excluding a memory cell identified with the permanent state, wherein the memory cell identified with the permanent state is between the memory cells identified respectively with the first and second data states; and reading the logical word from or writing the logical word to the memory cells allocated to the logical word. In some embodiments, the first row is configured to store a first physical word and a second physical word, wherein the first and second physical words share a common size greater than that of the logical word, and wherein the logical word is localized to memory cells corresponding to the first physical word. In some embodiments, the allocating is performed from left to right along the first row of the array. In some embodiments, the identifying includes: biasing the memory cells of the array in the first row to generate individual read currents through the memory cells, wherein read currents are different for the first data state, the second data state, and the permanent state; and comparing the read currents to multiple reference currents to identify the individual states of the memory cells of the array in the first row. In some embodiments, the logical word includes a data word and an ECC code, and wherein the method further includes: performing an ECC operation to generate or decode the ECC code, wherein the ECC operation and the allocating are performed by the same circuit. In some embodiments, the logical word includes a data word and an ECC code, and wherein the method further includes: performing an ECC operation on the logical word to generate or decode the ECC code, wherein the ECC operation and the allocating are independent of each other. In some embodiments, the method further includes: receiving an address for the reading or the writing, wherein the address identifies a second row of the plurality of rows; looking the second row up in a lookup table to determine whether the second row is mapped to a redundant row; and determining that the second row is mapped to the redundant row in the lookup table, wherein the redundant row is the first row. In some embodiments, the method further includes: identifying a tail memory cell in the first row, wherein the tail memory cell falls within a design specification but is at a boundary of the design specification; and setting the tail memory cell to the permanent state, wherein the memory cell identified with the permanent state is the tail memory cell.

In some embodiments, the present disclosure provides another method including: providing an array of memory cells having a plurality of rows, a plurality of data columns, and a redundant column, wherein each memory cell of the array has a first data state, a second data state, and a permanent state; reading a logical word from a first row of the array, wherein the logical word includes data from the plurality of data columns and is independent of the redundant column; identifying an abnormal memory cell in the first row and at a first data column of the plurality of data columns; setting the abnormal memory cell to the permanent state; and re-reading the logical word from the first row of the array, wherein the logical word includes data from the plurality of data columns, except the first data column, and further includes data from the redundant column. In some embodiments, the setting of the abnormal memory cell to the permanent state includes application of a high voltage across the abnormal memory cell to invoke irreversible dielectric breakdown of an insulator of the abnormal memory cell. In some embodiments, the abnormal memory cell is a failed memory cell. In some embodiments, the re-reading includes: identifying which memory cells in the first row are in the permanent state and which memory cells in the first row are in the first and second data states; allocating memory cells identified in the first and second data states to the logical word while skipping memory cells identified in the permanent state; and reading the logical word from the allocated memory cells. In some embodiments, the array of memory cells further has a plurality of second data columns and a second redundant column, wherein the re-reading includes receiving a column address identifying the data columns and the redundant column to the exclusion of the second data columns and the second redundant column.

In some embodiments, the present disclosure provides a memory device including: a memory core including: an array of memory cells having a plurality of rows and a plurality of columns, wherein each memory cell of the array has a first data state, a second data state, and a permanent state, and wherein the plurality of rows includes a first row; and a sense amplifier circuit configured to identify a memory cell of the first row as being in the permanent state and to identify memory cells of the first row as being respectively in the first and second data states, wherein the memory cell in the permanent state is between the memory cells respectively in the first and second data states; and an allocation circuit configured to allocate the memory cells identified as respectively being in the first and second data states to a logical word while excluding the memory cell identified as being in the permanent state; wherein the memory core is configured to read or write the logical word respectively from or to the memory cells allocated to the logical word. In some embodiments, the allocation circuit is configured to change the memory cells allocated to the logical word in response to a memory cell previously allocated to the logical word being set to the permanent state. In some embodiments, the sense amplifier circuit includes a sense amplifier configured to: compare a read current through a memory cell of the array to a reference current; identify the memory cell as being in the permanent state in response to the read current exceeding the reference current; and identify the memory cell as being in the first or second data state in response to the read current being below the reference current. In some embodiments, the sense amplifier circuit includes a sense amplifier configured to: compare a read current through a memory cell of the array to a reference current; identify the memory cell as being in the permanent state in response to the read current being below the reference current; and identify the memory cell as being in the first or second data state in response to the read current exceeding the reference current. In some embodiments, the logical word includes a data word and an ECC code, wherein the allocation circuit is further configured to generate or decode the ECC code during the read or write. In some embodiments, the logical word includes a data word and an ECC code, wherein the memory device includes: an ECC circuit configured to generate or decode the ECC code during the read or write, wherein the ECC circuit is independent of the allocation circuit. In some embodiments, the logical word comprises a data word and an ECC code, wherein the memory device further includes: an ECC circuit configured to generate or decode the ECC code during the read or write, wherein the ECC circuit is independent of and spaced from the allocation circuit. In some embodiments, each of the memory cells of the array includes a bottom electrode, a top electrode, and an insulator between the bottom and top electrodes, wherein the insulator of the memory cell identified in the permanent state is irreversibly broken down. In some embodiments, the memory cells are RRAM cells, MRAM cells, FeRAM cells, or 1S1R PCM cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing an array of memory cells in which each memory cell of the array has a first data state, a second data state, and a permanent state;
   performing a first read or write operation on a first logical word in a first row of the array, wherein the first logical word is allocated memory cells in a first set of columns; and
   performing a second read or write operation on a second logical word in a second row of the array after the first read or write operation, wherein the second logical word is allocated memory cells in a second set of columns, which overlaps with, but is different than, the first set of columns, and wherein the first set of columns excludes a column of the array while the second set of columns includes the column.

2. The method according to claim 1, wherein the column is between and borders a pair of columns of the first set of columns.

3. The method according to claim 1, wherein a first memory cell of the array at an intersection of the column and the first row is in the permanent state, and wherein a second memory cell of the array at an intersection of the column and the second row is in the first or second data state.

4. The method according to claim 1, wherein the memory cells allocated to the first logical word have only the first data state and/or the second data state, and wherein the memory cells allocated to the second logical word have only the first data state and/or the second data state.

5. The method according to claim 1, wherein the performing of the first read or write operation comprises:
   identifying which memory cells in the first row are in the permanent state and which memory cells in the first row are in the first and second data states; and
   allocating memory cells identified in the first data state and/or the second data state to the first logical word while skipping memory cells identified in the permanent state.

6. The method according to claim 1, wherein the first set of columns includes another column of the array while the second set of columns excludes the other column.

7. The method according to claim 1, wherein each memory cell of the array comprises a magnetic tunnel junction (MTJ), and wherein the permanent state corresponds to irreversible dielectric breakdown of a barrier element of the MTJ.

8. A method comprising:
   providing an array of memory cells in which each memory cell of the array has a first data state, a second data state, and a permanent state; and
   performing a read or write operation on a logical word allocated a set of memory cells, wherein the set of memory cells is in a first row of the array and includes only memory cells in the first data state and/or the second data state;
   wherein the array comprises a first memory cell in the permanent state, and a second memory cell in the first or second data state, during the read or write operation, wherein the first memory cell is between a pair of memory cells of the set of memory cells and is in the first row, and wherein the second memory cell is in a second row of the array and is in a same column of the array as the first memory cell.

9. The method according to claim 8, wherein the first memory cell has a lesser resistance than the second memory cell.

10. The method according to claim 8, wherein the first memory cell comprises a top electrode, a bottom electrode, and a dielectric layer between the top electrode and the bottom electrode, and wherein the method further comprises:
    setting the first memory cell to the permanent state by applying a high voltage across the dielectric layer, from the top electrode to the bottom electrode, to invoke irreversible dielectric breakdown of the dielectric layer.

11. The method according to claim 8, wherein the read or write operation is a write operation, and wherein the performing of the read or write operation comprises:

reading a physical word of the array that corresponds to the logical word;

allocating the set of memory cells to the logical word based on the reading; and writing data to the logical word after the reading of the physical word.

12. The method according to claim 11, wherein the reading determines a state of each memory cell of the physical word, and wherein the allocating allocates only memory cells determined to be in the first data state and/or the second data state to the logical word while skipping memory cells determined to be in the permanent state.

13. The method according to claim 8, further comprising:

performing another read or write operation on the logical word, which is allocated another set of memory cells, wherein the other set of memory cells overlaps with but is different than the set of memory cells.

14. The method according to claim 8, further comprising:

performing another read or write operation on another logical word allocated another set of memory cells, wherein the other set of memory cells includes the second memory cell, is in the second row of the array, and includes only memory cells in the first data state and/or the second data state.

15. A method comprising:

providing an array of memory cells in which each memory cell of the array has a first data state, a second data state, and a permanent state;

reading a physical word formed by a set of memory cells in a first row of the array, wherein the reading generates a read current through a memory cell of the set of memory cells;

comparing the read current of the memory cell concurrently to a permanent-state threshold and a data-state threshold to determine whether the memory cell is in the permanent state and to further determine whether the memory cell is in the first or second data state when not in the permanent state; and performing a read or write operation on a logical word formed by a subset of the set of memory cells, which is different depending on whether the memory cell is determined to be in the permanent state.

16. The method according to claim 15, wherein the subset of the set of memory cells excludes the memory cell in response to the memory cell being in the permanent state and includes the memory cell in response to the memory cell being in the first or second data state.

17. The method according to claim 15, wherein the permanent-state threshold is greater than the data-state threshold.

18. The method according to claim 15, wherein the comparing is performed by a pair of sense amplifiers, including one for each of the permanent-state threshold and the data-state threshold.

19. The method according to claim 15, wherein the performing of the read or write operation is a read operation, and wherein data of the logical word is determined from data of the physical word read by the reading.

20. The method according to claim 15, wherein the permanent state of the memory cell is unique to the memory cell and is separate from the permanent state of each other memory cell of the array.

* * * * *